(12) United States Patent  
Saito et al.

(10) Patent No.: US 11,965,941 B2
(45) Date of Patent: *Apr. 23, 2024

(54) MAGNETIC SENSOR

(71) Applicant: TDK Corporation, Tokyo (JP)

(72) Inventors: Yuta Saito, Tokyo (JP); Hiraku Hirabayashi, Tokyo (JP); Yoshihiro Kudo, Tokyo (JP)

(73) Assignee: TDK Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 18/299,475

(22) Filed: Apr. 12, 2023

(65) Prior Publication Data
US 2023/0243899 A1 Aug. 3, 2023

Related U.S. Application Data

(63) Continuation of application No. 17/850,391, filed on Jun. 27, 2022, now Pat. No. 11,656,301, which is a (Continued)

(30) Foreign Application Priority Data

Nov. 19, 2019 (JP) ................................ 2019-208486

(51) Int. Cl.
G01R 33/09 (2006.01)
(52) U.S. Cl.
CPC ......... *G01R 33/093* (2013.01); *G01R 33/098* (2013.01)
(58) Field of Classification Search
CPC ............................ G01R 33/093; G01R 33/098
See application file for complete search history.

(56) References Cited

U.S. PATENT DOCUMENTS 11,656,301 B2 * 5/2023 Saito .................. G01R 33/0076
324/252
2002/0142490 A1 10/2002 Sato et al.
(Continued)

FOREIGN PATENT DOCUMENTS

DE 102005054007 A1 5/2007
DE 102009006144 A1 10/2009
(Continued)

OTHER PUBLICATIONS

Office Action dated Dec. 17, 2022 in corresponding DE Patent Application No. 102020130164.2 (English translation only).

*Primary Examiner* — Alesa Allgood
(74) *Attorney, Agent, or Firm* — POSZ LAW GROUP, PLC

(57) ABSTRACT

A magnetic sensor includes a magnetic sensor chip that includes a magnetoresistive effect element and a sealed part. The magnetoresistive effect element includes a free layer and a pinned layer. The sealed part has a first surface and a second surface, which is opposite the first surface. The shape of the sealed part in the plan view from the first surface side is substantially quadrilateral. The substantially quadrilateral shape has a first side and a second side, which are substantially parallel to each other. In the plan view, from the first surface side of the sealed part, the magnetization direction of the pinned layer, in a state in which the external magnetic field is not applied on the magnetoresistive effect element, is inclined with respect to an approximately straight line found through the least squares method using a plurality of points arbitrarily set on the first side.

7 Claims, 19 Drawing Sheets

Related U.S. Application Data continuation of application No. 17/094,171, filed on Nov. 10, 2020, now abandoned.

(56) References Cited

U.S. PATENT DOCUMENTS

| | | | |
|---|---|---|---|
| 2004/0232536 A1* | 11/2004 | Fukuzumi | H01L 23/057 257/E23.114 |
| 2009/0027048 A1 | 1/2009 | Sato et al. | |
| 2009/0189601 A1 | 7/2009 | Okada et al. | |
| 2013/0335073 A1* | 12/2013 | Deak | G01R 33/098 324/207.21 |
| 2014/0340081 A1 | 11/2014 | Kurumado | |
| 2016/0351800 A1 | 12/2016 | Kolb et al. | |
| 2018/0231618 A1 | 8/2018 | Ohta et al. | |
| 2019/0277660 A1 | 9/2019 | Makino et al. | |

FOREIGN PATENT DOCUMENTS

| | | |
|---|---|---|
| DE | 102017126280 A1 | 8/2018 |
| JP | 2002-299728 A | 10/2002 |
| JP | 2005-337866 A | 12/2005 |
| JP | 2006-308573 A | 11/2006 |
| JP | 2007281505 A | 10/2007 |
| JP | 2009-162499 A | 7/2009 |
| JP | 2009-229296 A | 10/2009 |
| JP | 2017122645 A | 7/2017 |
| JP | 2019-158535 A | 9/2019 |
| JP | 2020-153771 A | 9/2020 |

\* cited by examiner

MAGNETIC SENSOR

CROSS REFERENCE TO RELATED APPLICATIONS

This application is a continuation application of U.S. Utility application Ser. No. 17/850,391 filed on Jun. 27, 2022, which is a continuation application of U.S. Utility application Ser. No. 17/094,171 filed on Nov. 10, 2020, which is based on Japanese Patent Application No. 2019-208486 filed on Nov. 19, 2019, the contents of which are incorporated herein by reference.

TECHNICAL FIELD

The present invention relates to a magnetic sensor.

BACKGROUND

Magnetoresistive effect elements (MR elements) such as giant magnetoresistive effect elements (GMR elements), tunnel magnetoresistive effect elements (TMR elements), anisotropic magnetoresistive effect elements (MR elements) and the like have been applied in the field of magnetic sensors. For example, GMR elements or TMR elements include a pinned layer, in which the magnetization direction is fixed, and a free layer, in which the magnetization direction changes in accordance with an external magnetic field. When the strength of the external magnetic field applied on the magnetoresistive effect element changes, the magnetization direction of the free layer changes and the angle formed by the magnetization direction of the pinned layer and the magnetization direction of the free layer changes. Through the change in this angle, the resistance value of the magnetoresistive effect element changes, and through the change in this resistance value, it is possible to detect changes in the strength of the external magnetic field.

A magnetic sensor that uses this kind of magnetoresistive effect element, for example, has at least a magnetic sensor chip comprising a magnetoresistive effect element and a sealed part, which is sealed in order to protect this magnetic sensor chip, and is used, for example, as an electric current sensor, an angle sensor or the like.

PATENT LITERATURE

PATENT LITERATURE 1 JP Laid-Open Patent Application No. 2009-162499

Problem to be Solved by the Invention

In a magnetic sensor having a configuration in which the magnetic sensor chip is sealed by the sealed part, stress from outside the magnetic sensor is at times applied on the magnetic sensor chip during and after manufacturing of the magnetic sensor. When an external magnetic field is not applied on the magnetoresistive effect element, the magnetization of the free layer is oriented in a fixed direction by a bias magnet, but when the stress is received, the magnetization direction of the free layer may change due to an inverse magnetostrictive effect. When the magnetization direction of the free layer on which an external magnetic field is not applied changes from the prescribed direction, there is a concern that there could be an effect on the change in the resistance value of the magnetoresistive effect element when an external magnetic field is applied, that is, on the output of the magnetic sensor when an external magnetic field is applied. For example, in an electric current sensor that uses a magnetic sensor having a magnetoresistive effect element, the electric current value detected in a state in which stress is applied on the magnetic sensor chip includes errors, creating the problem that this kind of magnetic sensor cannot be used in applications in which the electric current value or the like that is the target of detection needs to be detected stably and with high precision.

In addition, a TMR-type magnetoresistive effect element has a high MR ratio compared to a GMR-type or AMR-type magnetoresistive effect element and has markedly superior output properties but is also sensitive to external stress applied on the magnetic sensor chip, the output of the magnetic sensor could be greatly affected.

External stress applied on the magnetic sensor chip is difficult to predict, and even if such could be predicted, controlling such external stress is difficult. Accordingly, in order to secure the detection precision of the magnetic sensor, it is desirable for the magnetic sensor to have a configuration in which output is unlikely to be greatly caused to fluctuate by external stress.

In consideration of the foregoing, it is an object of the present invention to provide a magnetic sensor in which it is possible to suppress fluctuations in output caused by stress applied from the outside.

Means for Solving the Problem

To achieve such an object, the present invention provides a magnetic sensor comprising a magnetic sensor chip that includes a magnetoresistive effect element and a sealed part that integrally seals the magnetic sensor chip. The magnetoresistive effect element includes a free layer, the magnetization direction of which can change in accordance with an external magnetic field, and a pinned layer, the magnetization direction of which is fixed. The sealed part has a first surface and a second surface, which is opposite the first surface. The shape of the sealed part in the plan view from the first surface side is substantially quadrilateral. The substantially quadrilateral shape has a first side and a second side, which are substantially parallel to each other, and a third side and a fourth side, which are substantially parallel to each other and that intersect the first side and the second side. In the plan view from the first surface side of the sealed part, the magnetization direction of the pinned layer, in a state in which the external magnetic field is not applied on the magnetoresistive effect element, is inclined with respect to an approximately straight line found through the least squares method using a plurality of points arbitrarily set on the first side.

The magnetization direction of the pinned layer, in a state in which the external magnetic field is not applied on the magnetoresistive effect element, may be inclined at an angle of 10~80° with respect to the approximately straight line.

The shape in the plan view of the magnetic sensor chip may be substantially a quadrilateral having a first side and a second side, which are substantially parallel to each other, and a third side and a fourth side, which are substantially parallel to each other and which intersect the first side and the second side, the first side of the magnetic sensor chip and the approximately straight line are substantially parallel, and when the magnetic sensor chip is viewed from the first surface side of the sealed part, the magnetization direction of the pinned layer in a state in which the external magnetic field is not applied on the magnetoresistive effect element may be inclined with respect to the first side of the magnetic sensor chip.

The shape in the plan view of the magnetic sensor chip may be substantially a quadrilateral having a first side and a second side, which are substantially parallel to each other, and a third side and a fourth side, which are substantially parallel to each other and which intersect the first side and the second side, and when the magnetic sensor chip is viewed from the first surface side of the sealed part, the magnetization direction of the pinned layer, in a state in which the external magnetic field is not applied on the magnetoresistive effect element, may be substantially parallel to or substantially orthogonal to the first side of the magnetic sensor chip, and the first side of the magnetic sensor chip may be inclined with respect to the approximately straight line.

The magnetic sensor chip may include a plurality of the magnetoresistive effect elements and the magnetization directions of the free layers of the magnetoresistive effect elements in a state in which the external magnetic field is not applied on the plurality of magnetoresistive effect elements may correspond to each other, the magnetoresistive effect element may be a GMR element or a TMR element, and the sealed part may include a resin.

Efficacy of the Invention

With the present invention, it is possible to provide a magnetic sensor in which it is possible to suppress fluctuations in output caused by stress applied from the outside.

BEST MODE FOR IMPLEMENTING THE INVENTION

Below, an embodiment of the magnetic sensor of the present invention is described with reference to the drawings.

In the description of the magnetic sensor according to this embodiment, as necessary the "X direction, Y direction and Z direction" are stipulated in a number of the drawings. Here, the X direction matches the magnetization direction of the pinned layer of the magnetoresistive effect element. The Y direction is a direction orthogonal to the X direction and matches the magnetization direction of the free layer in a state in which an external magnetic field is not applied. The Z direction is a direction orthogonal to the X direction and the Y direction and matches the layering direction of the multilayer film of the magnetoresistive effect element. The orientation of arrows indicating the X, Y and Z directions in each of the drawings indicates the +X direction, +Y direction and +Z direction, and the orientation on the opposite side from the orientation of the arrows indicates the −X direction, −Y direction and −Z direction.

Figure 1:
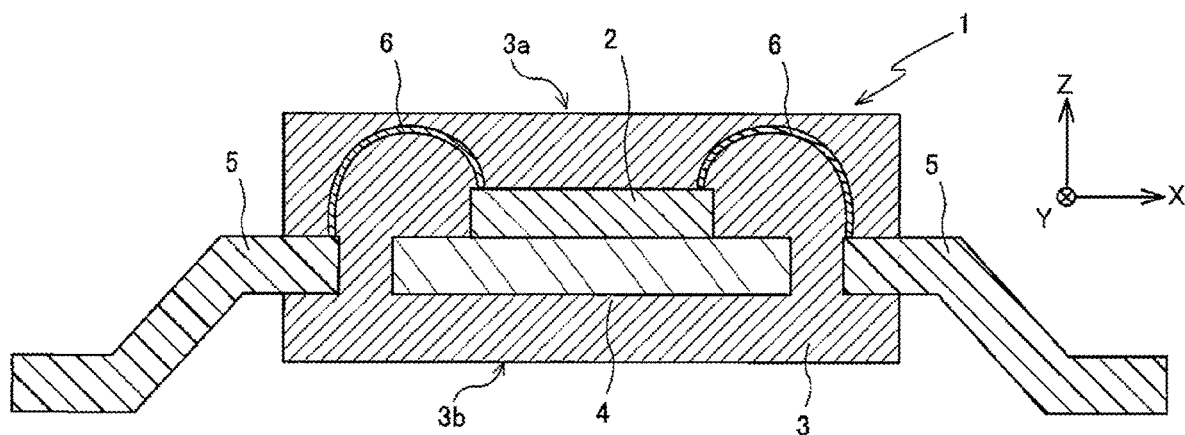
FIG. 1 is a schematic cross-sectional view showing a schematic configuration from a side perspective of a magnetic sensor according to an embodiment of the present invention.
Figure 2:
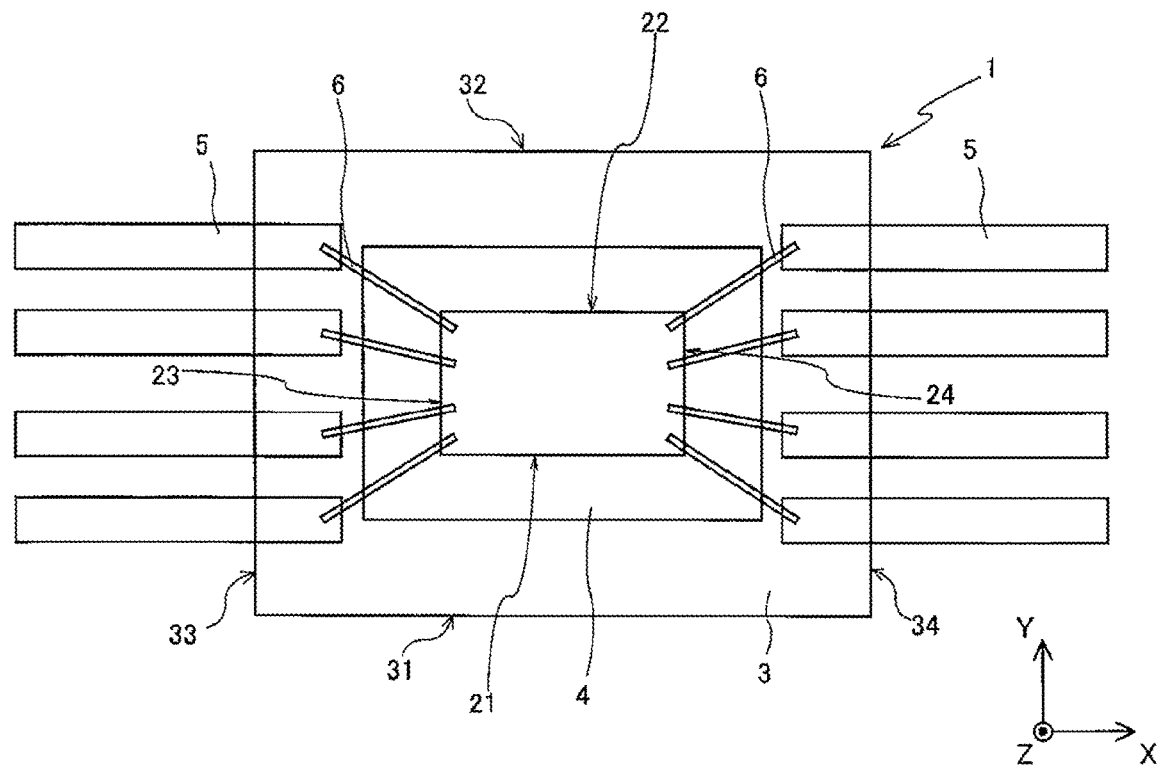
FIG. 2 is a plan view showing the schematic configuration of the internal structure in a plan view from a first surface side of the sealed part of the magnetic sensor shown in FIG. 1.

FIG. 1 is a schematic cross-sectional view showing a schematic configuration from a side perspective of a magnetic sensor according to this embodiment, and FIG. 2 is a plan view showing the schematic configuration of the internal structure from a first surface side of the sealed part of the magnetic sensor shown in FIG. 1.

As shown in FIG. 1 and FIG. 2, a magnetic sensor 1 includes a magnetic sensor chip 2 and a sealed part 3, which is sealed integrally with the magnetic sensor chip 2. The sealed part 3 has a first surface 3a and a second surface 3b, which is opposite the first surface 3a, and the shape of the sealed part 3 in a plan view from the first surface 3a side is a substantially quadrilateral shape with a first side 31 and second side 32, which are substantially parallel to each other, and a third side 33 and a fourth side 34, which are substantially parallel to each other and intersect the first side 31 and the second side 32. Preferably, the sealed part 3 has the first surface 3a and the second surface 3b, which is opposite the first surface 3a. The shape of the sealed part 3 in a plan view from the first surface 3a side is a substantially square shape having the first side 31 and the second side 32, which are substantially parallel to each other. The third side 33 and the fourth side 34 are substantially parallel to each other and substantially orthogonal to the first side 31 and the second side 32.

The magnetic sensor chip 2 has a substantially quadrilateral shape with a first side 21 and a second side 22, which are substantially parallel to each other in the plan view, and a third side 23 and a fourth side 24, which are substantially parallel to each other and which intersect the first side 21 and the second side 22. Preferably, the magnetic sensor chip 2 is a substantially square shape with the first side 21 and the second side 22 substantially parallel to each other in the plan view and the third side 23 and the fourth side 24 substantially parallel to each other and substantially orthogonal to the first side 21 and the second side 22. In addition, the magnetic sensor chip 2 comprises a magnetoresistive effect element. As the magnetoresistive effect element, it is possible, for example, to use a giant magnetoresistive effect (GMR) type magnetoresistive effect element or a tunnel magnetoresistive effect (TMR) type magnetoresistive effect element.

In this embodiment, substantially parallel and substantially orthogonal and substantially quadrilateral shape and substantially square shape are concepts that include manufacturing errors and the like at the time of manufacturing the magnetic sensor chip 2 and the sealed part 3. For substantially parallel, an extension line extending along the first side 31 of the sealed part 3 and an extension line extending along the second side 32 may intersect so that the angle formed by the two extension lines is 3° or less. For substantially orthogonal, the angle formed by the first side 31 and the third side 33 or the angle formed by an extension line extending along the first side 31 and an extension line extending along the third side 33 may be within the range of 89~91°. In addition, for the substantially quadrilateral shape and the substantially square shape, in the plan view from the first surface 3a side, the first surface 3a of the sealed part 3 may be a quadrilateral with rounded corners, a square with rounded corners, a rectangle with rounded corners, or a quadrilateral in which C-chamfering has been implemented on the corners, a square in which C-chamfering has been implemented on the corners, a rectangle in which C-chamfering has been implemented on the corners, or the like. Furthermore, for substantially parallel, an extension line extending along the first side 21 of the magnetic sensor chip 2 and an extension line extending along the second side 32 may intersect so that the angle formed by the two extension lines is 3° or less. For substantially orthogonal, the angle formed by the first side 21 and the third side 23 or the angle formed by an extension line extending along the first side 21 and an extension line extending along the third side 23, may be within the range of 89~91°. Furthermore, for a substantially quadrilateral shape and a substantially square shape, in the plan view, the magnetic sensor chip 2 may be a quadrilateral with rounded corners, a square with rounded corners, a rectangle with rounded corners, or a quadrilateral in which C-chamfering has been implemented on the corners, a square in which C-chamfering has been implemented on the corners, a rectangle in which C-chamfering has been implemented on the corners, or the like.

The sealed part 3 possessed by the magnetic sensor 1 should be one that is sealed integrally with and protects the magnetic sensor chip 2 and, for example, may be composed of resin. When stress from the outside is applied on the magnetic sensor 1, the sealed part 3 can mitigate the effects of stress applied on the magnetic sensor chip 2 by exhibiting a cushioning action against this stress. The elastic modulus of the resin composing this sealed part 3 should be for example around 0.1~50 GPa. Examples of the resin that can form the sealed part 3 include epoxy resin, styrene resin, ABS resin and the like. The dimensions of the sealed part 3 are not particularly limited as long as the magnetic sensor chip 2 can be integrally sealed and can be appropriately set in accordance with the application or the like.

The magnetic sensor 1 according to this embodiment may also comprise a die pad 4 having a mounting surface for mounting the magnetic sensor chip 2, a plurality of lead wires 5 placed surrounding the die pad 4, and a wiring unit 6 that electrically connects the lead wires 5 and the terminals of the magnetic sensor chip 2. The die pad 4 should be composed of an electrically conductive material such as copper or the like. The magnetic sensor chip 2 should be fixed to the mounting surface of the die pad 4 by an adhesive (undepicted) such as conductive paste, insulating paste, die attach film (DAF) or the like. The wiring unit 6 can be composed of bonding wire or the like made of gold wires or the like.

Figure 3A:
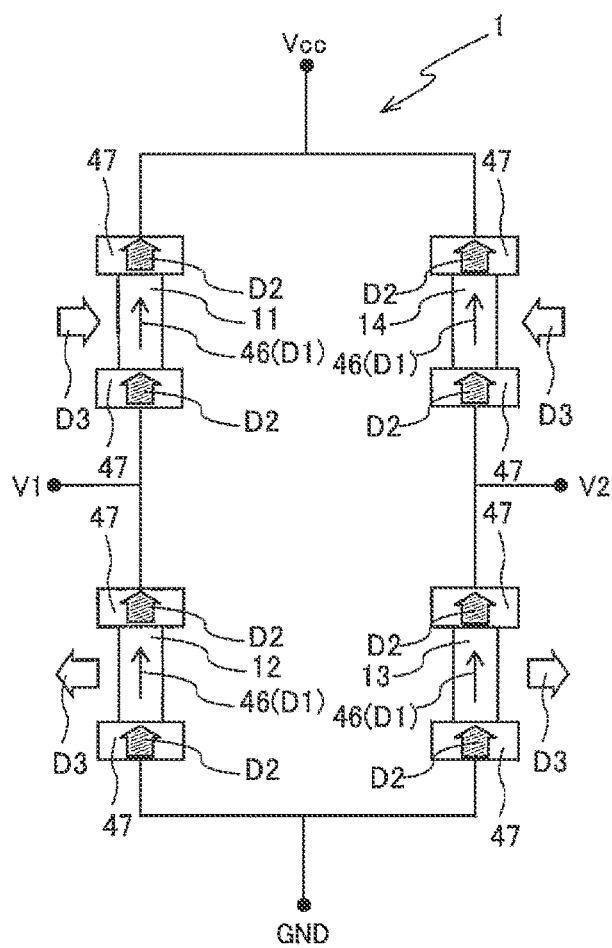
FIG. 3A is a circuit diagram showing the schematic configuration of the magnetic sensor according to the embodiment of the present invention.

FIG. 3A is a circuit diagram showing the schematic configuration of the magnetic sensor according to this embodiment. The magnetic sensor 1 includes a first magnetoresistive effect element 11, a second magnetoresistive effect element 12, a third magnetoresistive effect element 13 and a fourth magnetoresistive effect element 14, and the first through fourth magnetoresistive effect elements 11~14 are connected to each other with a bridge circuit (Wheatstone bridge). The first through fourth magnetoresistive effect elements 11~14 are divided into two groups, namely a group consisting of the first magnetoresistive effect element 11 and the second magnetoresistive effect element 12 and a group consisting of the third magnetoresistive effect element 13 and the fourth magnetoresistive effect element 14, and the magnetoresistive effect elements within each of these pairs are connected in series. The first magnetoresistive effect element 11 and the fourth magnetoresistive effect element 14 are connected to a power source voltage Vcc, and the second magnetoresistive effect element 12 and the third magnetoresistive effect element 13 are connected to ground (GND). The output voltage between the first magnetoresistive effect element 11 and the second magnetoresistive effect element 12 is taken out as a midpoint voltage V1, and the output voltage between the third magnetoresistive effect element 13 and the fourth magnetoresistive effect element 14 is taken out as a midpoint voltage V2. Accordingly, when the electrical resistances of the first through fourth magnetoresistive effect elements 11~14 are called R1~R4, respectively, the midpoint voltages V1 and V2 can be found from the following equations (1) and (2), respectively.

Formula 1]
$$V_1 = \frac{R_2}{R_1 + R_2} V_{cc} \quad (1)$$

Formula 2]
$$V_2 = \frac{R_3}{R_3 + R_4} \quad (2)$$

In this embodiment, the description takes as an example a configuration in which each of the first through fourth magnetoresistive effect elements 11~14 comprises a single magnetoresistive effect element, but each of the first through fourth magnetoresistive effect elements 11~14 may comprise a plurality of magnetoresistive effect elements, or each of the first through fourth magnetoresistive effect elements 11~14 may comprise a plurality of magnetoresistive effect elements connected in series.

Figure 4A:
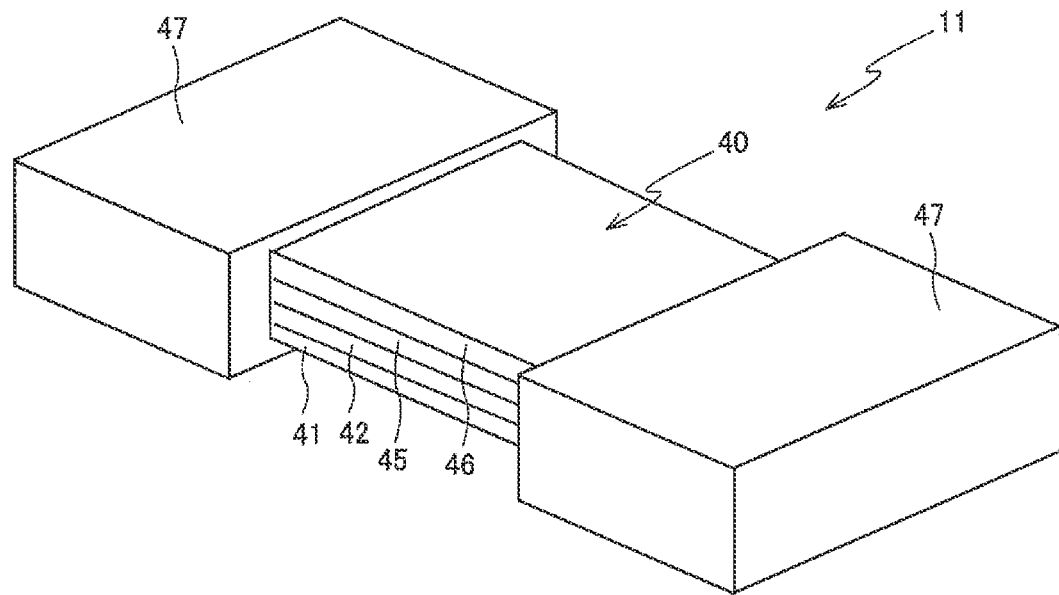
FIG. 4A is a perspective view showing the schematic configuration of the magnetoresistive effect element of the magnetic sensor according to the embodiment of the present invention.

Because the first through fourth magnetoresistive effect elements 11~14 have the same structure, the description will take the first magnetoresistive effect element 11 as an example. FIG. 4A is a perspective view showing the schematic configuration of the magnetoresistive effect element (the first magnetoresistive effect element 11) of the magnetic sensor according to this embodiment. The first magnetoresistive effect element 11 includes a multilayer film 40, which has a substantially rectangular in the plan view, and a pair of bias magnets 47, which are positioned at both ends of the multilayer film 40 in the lengthwise direction so that the multilayer film 40 is located in between the bias magnets 47. The multilayer film 40 has a general spin-valve-type film composition. The multilayer film 40 includes an antiferromagnetic layer 41, a pinned layer 42, a spacer layer 45 and a free layer 46, and these layers are layered in this order. The multilayer film 40 is located between a pair of electrode layers (undepicted) in this layering direction and is configured so that a sense electric current flows in the layering direction from the electrode layer to the multilayer film 40. In this embodiment, the shape of the multilayer film 40 in the plan view is a substantially square shape but may be a substantially rectangular shape. Here, the substantially square shape or substantially rectangular shape includes, besides a square shape and a rectangular shape, a square shape having rounded corners, a rectangular shape having rounded corners, and the like. In addition, in this embodiment, the first through fourth magnetoresistive effect elements 11~14 have a pair of bias magnets 47 with the multilayer film 40 located in between the bias magnets 47, but this is intended to be illustrative and not limiting and, for example, in the case of a rectangular shape or oval shape including an ellipse in which the multilayer film 40 uses magnetic shape anisotropy, the bias magnets 47 need not be present.

The free layer 46 is a magnetic layer, the magnetization direction of which changes in accordance with the external magnetic field, and is composed of, for example, NiFe, CoFe, CoFeB, CoFeNi, Co$_2$MnSi, Co$_2$MnGe, FeOx (Fe oxides), or the like. The pinned layer 42 is a ferromagnetic layer, the magnetization direction of which is fixed with respect to the external magnetic field through exchange coupling with the antiferromagnetic layer 41 and is composed of the same magnetic material as the free layer 46. The antiferromagnetic layer 41 is composed, for example, of an antiferromagnetic material including Mn and at least one type of element selected from among the group of Pt, Ru, Rh, Pd, Ni, Cu, Ir, Cr and Fe. The Mn content in the antiferromagnetic material should be around 35~95 atom %, for example. The spacer layer 45 is positioned between the free layer 46 and the pinned layer 42 and is a nonmagnetic layer that exhibits the magnetoresistive effect. The spacer layer 45 is a nonmagnetic conductive layer composed of a nonmagnetic metal, such as Cu or the like, or is a tunnel barrier layer composed of a nonmagnetic insulator such as Al$_2$O$_3$. When the spacer layer 45 is a nonmagnetic conductive layer, the first magnetoresistive effect element 11 functions as a giant magnetoresistive effect (GMR) element, and when the spacer layer 45 is a tunnel barrier layer, the first magnetoresistive effect element 11 functions as a tunnel magnetoresistive effect (TMR) element. To make the magnetoresistive effect large and increase the output voltage of the bridge circuit, the first magnetoresistive effect element 11 is more preferably a TMR element.

Figure 4B:
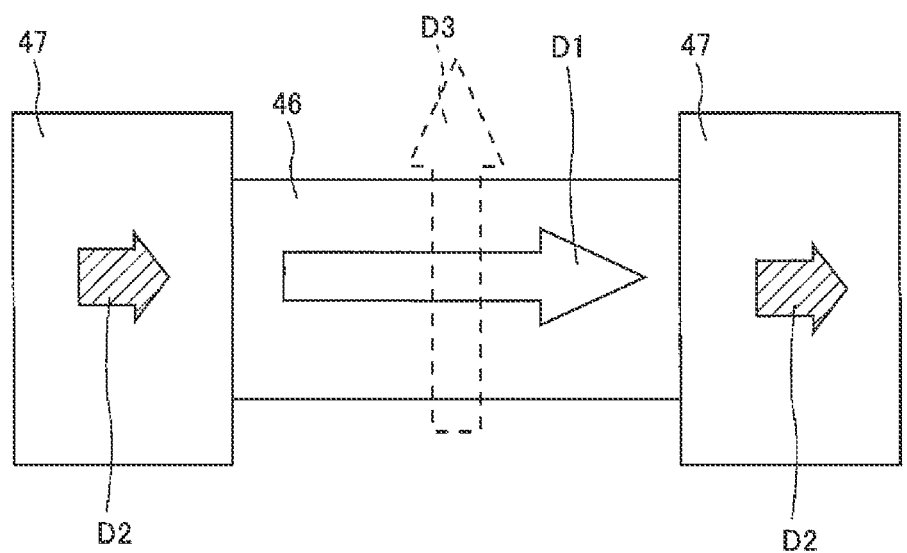
FIG. 4B is a plan view when the magnetoresistive effect element shown in FIG. 4A is viewed from the free layer side.
Figure 5A:
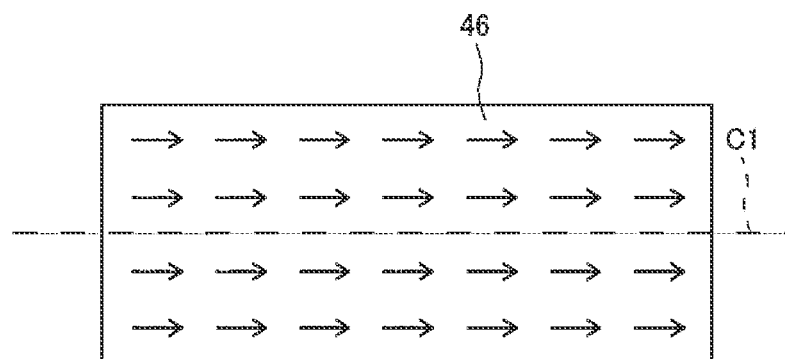
FIG. 5A is a schematic diagram conceptually showing the magnetization of the free layer in a state in which an external magnetic field is not applied.
Figure 5B:
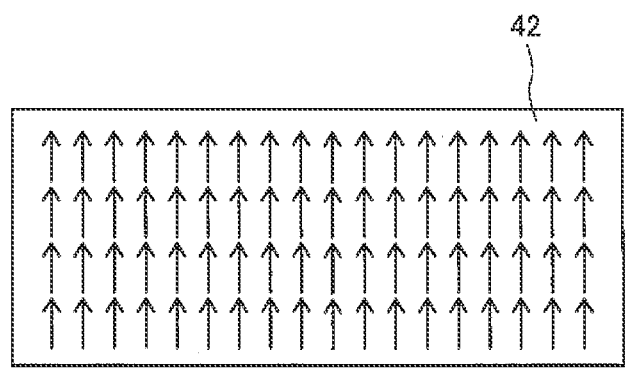
FIG. 5B is a schematic diagram conceptually showing the magnetization of the pinned layer in a state in which an external magnetic field is not applied.

FIG. 4B is a plan view showing the schematic composition of the magnetoresistive effect element (first magnetoresistive effect element 11) shown in FIG. 4A when viewed from the free layer 46 side. FIG. 5A is a schematic diagram conceptually showing the magnetization of the free layer 46 in a state in which an external magnetic field is not applied. FIG. 5B is a schematic diagram conceptually showing the magnetization of the pinned layer 42 in a state in which an external magnetic field is not applied. Arrows in FIG. 5A and FIG. 5B schematically show the magnetization directions.

The free layer 46 is magnetized in an initial magnetization direction D1 substantially parallel to the lengthwise direction in the plan view through the bias magnetic field of the bias magnets 47. The initial magnetization direction D1 of the free layer 46 is substantially parallel to the magnetization direction D2 of the bias magnets 47. The pinned layer 42 is magnetized in a magnetization direction D3 substantially parallel to the short direction. When an external magnetic field in the short direction, which is the magnetically sensitive direction of the free layer 46, is applied, the magnetization of the free layer 46 rotates clockwise or anticlockwise in FIG. 4B in accordance with the strength of the external magnetic field. Through this, the relative angle between the magnetization direction D3 of the pinned layer 42 and the magnetization direction of the free layer 46 changes, and the electrical resistance to the sense electric current changes.

Figure 3B:
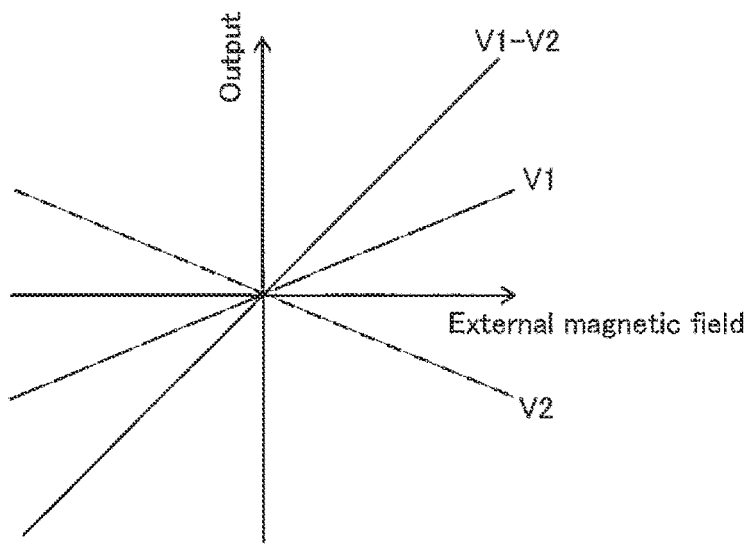
FIG. 3B is a graph showing measurement results for output of the magnetic sensor shown in FIG. 3A.

As shown in FIG. 3A, the initial magnetization direction D1 of the free layer 46 in the first through fourth magnetoresistive effect elements 11~14 is the lengthwise direction of the free layer 46. The magnetization direction D3 of the pinned layers 42 of the first magnetoresistive effect element 11 and the third magnetoresistive effect element 13 is the short direction of the pinned layer 42, and the magnetization direction D3 of the pinned layers 42 of the second magnetoresistive effect element 12 and the fourth magnetoresistive effect element 14 is antiparallel to the magnetization direction D3 of the pinned layers 42 of the first magnetoresistive effect element 11 and the third magnetoresistive effect element 13. Accordingly, when an external magnetic field in the magnetization direction D3 of the pinned layers 42 of the first magnetoresistive effect element 11 and the third magnetoresistive effect element 13 is applied, the electrical resistance of the first magnetoresistive effect element 11 and the third magnetoresistive effect element 13 decreases, and the electrical resistance of the second magnetoresistive effect element 12 and the fourth magnetoresistive effect element 14 increases. Through this, the midpoint voltage V1 increases and the midpoint voltage V2 decreases, as shown in FIG. 3B. On the other hand, when an external magnetic field in the magnetization direction D3 of the pinned layers 42 of the second magnetoresistive effect element 12 and the fourth magnetoresistive effect element 14 is applied, the midpoint voltage V1 decreases and the midpoint voltage V2 increases. By detecting the difference (V1-V2) between the midpoint voltage V1 and the midpoint voltage V2, twice the sensitivity can be obtained compared to detecting the midpoint voltage V1 and the midpoint voltage V2. In addition, even if the midpoint voltage V1 and the midpoint voltage V2 in FIG. 3B shift (offset) in the same direction (for example, upwards in the graph in FIG. 3B), by detecting the difference (V1-V2) between the midpoint voltage V1 and the midpoint voltage V2, it is possible to exclude the effects of the offset.

Figure 3C:
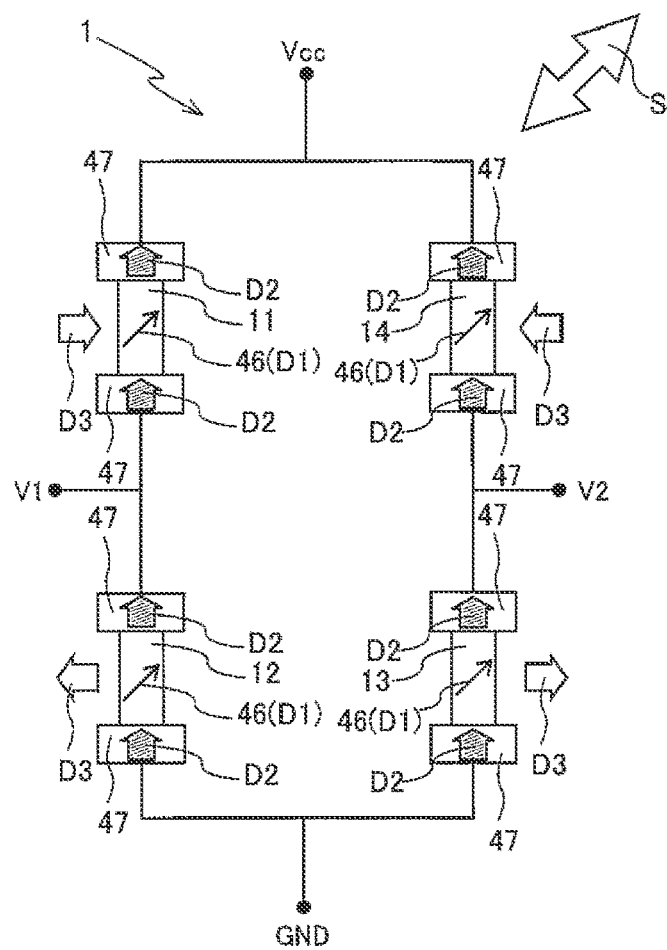
FIG. 3C is a circuit diagram showing the schematic configuration in a state in which stress at a 45° direction is applied on the magnetic sensor shown in FIG. 3A.
Figure 3D:
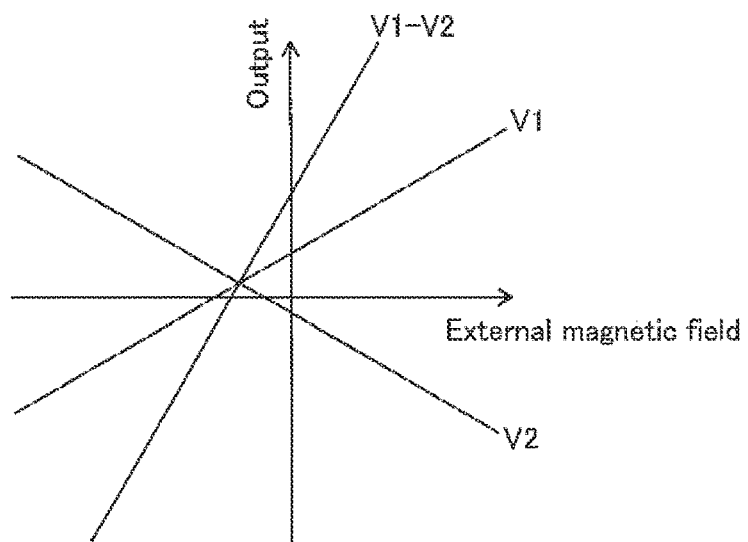
FIG. 3D is a graph showing measurement results for output of the magnetic sensor shown in FIG. 3C.

When stress in a prescribed direction is applied on the first through fourth magnetoresistive effect elements 11~14, the initial magnetization direction D1 of the free layer 46 rotates due to an inverse magnetostrictive effect. FIG. 3C is a schematic drawing showing a state in which a tensile stress S is applied at a 45° angle with respect to the lengthwise direction of the free layer 46 of the first through fourth magnetoresistive effect elements 11~14. The inverse magnetostrictive effect acts in different directions depending on whether the magnetostrictive constant is negative or positive and whether the stress is a tensile stress S or a compression stress. When the magnetostrictive constant of the free layer 46 on which a tensile stress is applied is positive, and when the magnetostrictive constant of the free layer 46 on which a compression stress is applied is negative, the initial magnetization direction D1 of the free layer 46 rotates to a direction parallel to the stress. When the magnetostrictive constant of the free layer 46 on which the tensile stress S is applied is negative, and when the magnetostrictive constant of the free layer 46 on which a compression stress is applied is positive, the initial magnetization direction D1 of the free layer 46 rotates to a direction orthogonal to the stress. As shown in FIG. 3C, when the tensile stress S is applied at a 45° angle, the magnetostrictive constant of the free layer 46 becomes negative and the initial magnetization direction D1 of the free layers 46 of the first magnetoresistive effect element 11 and the third magnetoresistive effect element 13 rotates to the orientation of the magnetization direction D3 of the pinned layer 42, so the electrical resistance of the first magnetoresistive effect element 11 and the third magnetoresistive effect element 13 decreases. The initial magnetization direction D1 of the free layer 46 of the second magnetoresistive effect element 12 and the fourth magnetoresistive effect element 14 rotates to the opposite direction of the magnetization direction D3 of the pinned layer 42, so the electrical resistance of the second magnetoresistive effect element and the fourth magnetoresistive effect element 14 increases. Through this, as shown in FIG. 3D, the midpoint voltage V1 increases and the midpoint voltage V2 decreases, so the difference (V1-V2) between the midpoint voltage V1 and the midpoint voltage V2 increases. That is, through the external stress, the above-described difference (V1-V2) that is the output of the magnetic sensor 1 when no external magnetic field is applied is offset from zero. There is concern that the offset of the output (the above-described difference V1-V2) could affect the detection accuracy of the magnetic sensor 1.

The external stress can occur due to a force received from the resin or the like used for sealing when the magnetic sensor chip 2 is enclosed by resin, for example. Stress can also occur in procedures (for example, soldering procedures) when mounting the magnetic sensor 1 in which the magnetic sensor chip 2 is sealed in the sealed part 3 on a substrate to form a module. Stress can arise in procedures (for example, screwing procedures) when the module is incorporated into a product, and even when used as a product, thermal stress can arise through temperature changes, for example. Such stress is difficult to predict and measure and is also difficult to control. Accordingly, what is essentially desired is for the output (the above-described difference V1-V2) of the magnetic sensor 1 to not be affected by external stress.

Figure 6:
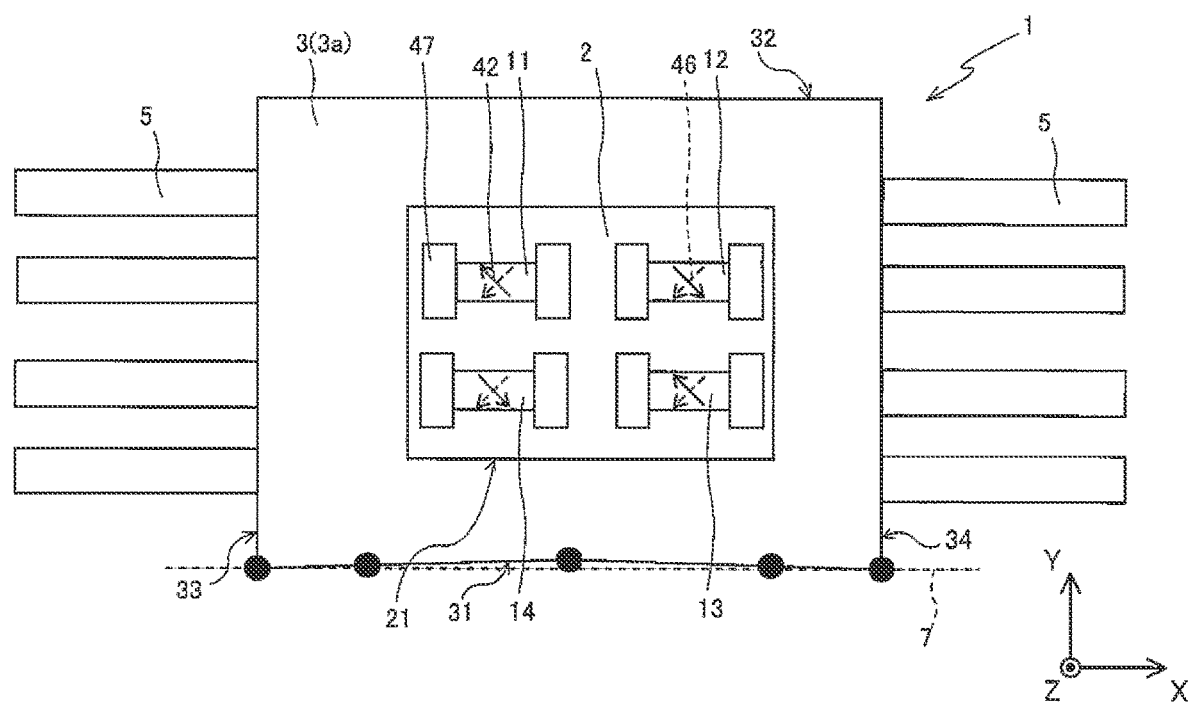
FIG. 6 is a plan view showing the positional relationship between the magnetization direction of the pinned layer and the sealed part and magnetic sensor chip of the magnetic sensor according to the embodiment of the present invention.

FIG. 6 is a plan view showing the positional relationship between the magnetization direction of the pinned layer 42 and the sealed part 3 and magnetic sensor chip 2 of the magnetic sensor according to this embodiment. As shown in FIG. 6, in the magnetic sensor 1 according to this embodiment, the magnetization direction of the pinned layer 42 is inclined with respect to the approximately straight line 7 found through the least squares method using a plurality of points arbitrarily set on the first side 31 of the sealed part 3. Through this, it is possible to reduce the stress sensitivity of the magnetic sensor 1, and to realize the effect of improving offset properties. In this embodiment, an arbitrary plurality of points was set on the first side 31 in order to find the approximately straight line 7, but this is intended to be illustrative and not limiting, for the approximately straight line 7 may be found by setting a plurality of points arbitrarily on any one of the sides out of the first side 31, the second side 32, the third side 33 and the fourth side 34.

In the magnetic sensor 1 according to this embodiment, the lengthwise direction of the pinned layer 42 of the first through fourth magnetoresistive effect elements 11~14 is inclined with respect to the first side 21 of the magnetic sensor chip 2, and the first side 21 of the magnetic sensor chip 2 and the above-described approximately straight line 7 found through the least squares method using a plurality of points arbitrarily set on the first side 31 of the sealed part 3 are substantially parallel, and through this the magnetization direction of the pinned layer 42 may be inclined with respect to the above-described approximately straight line 7 (see FIG. 6). In this embodiment, the state shown in FIG. 6 is intended to be illustrative and not limiting, for the magnetization direction of the pinned layer 42 may be caused to incline with respect to the above-described approximately straight line 7 by making the lengthwise or short direction of the pinned layer 42 of the first through fourth magnetoresistive effect elements 11~14 and the first side 21 of the magnetic sensor chip 2 be substantially parallel and by causing the first side 21 of the magnetic sensor chip 2 to be inclined with respect to the above-described approximately straight line 7 found through the least squares method using a plurality of points arbitrarily set on the first side 31 of the sealed part 3 (see FIG. 7).

Figure 8A:
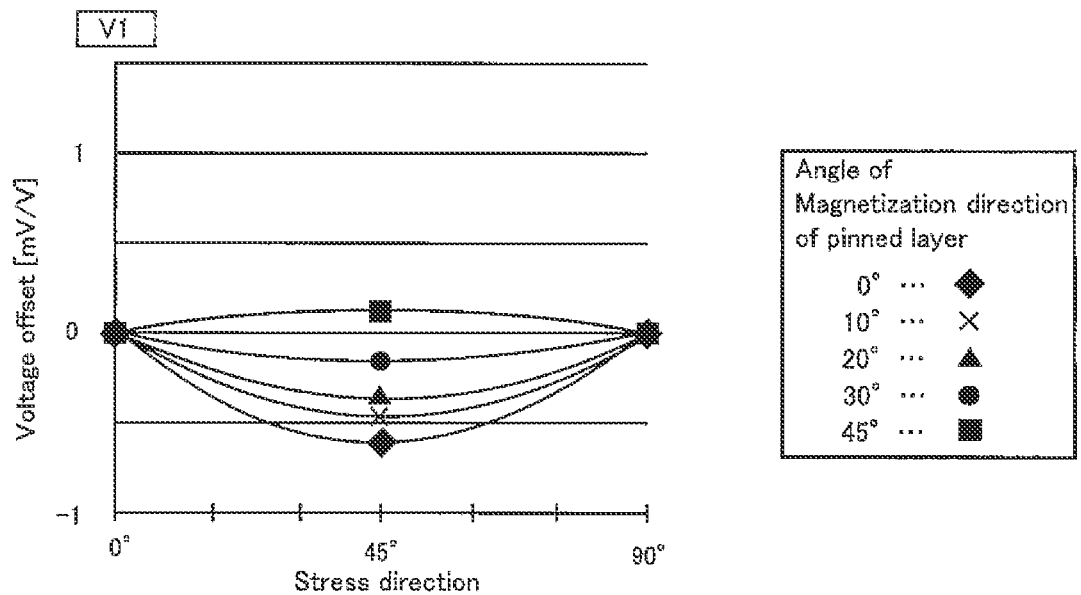
FIG. 8A is a graph showing the relationship between voltage offset and the applied angle of external stress at an output voltage V1 when the pinned layer of the magnetic sensor is inclined at 0°, 10°, 20°, 300 and 45°, respectively.
Figure 8B:
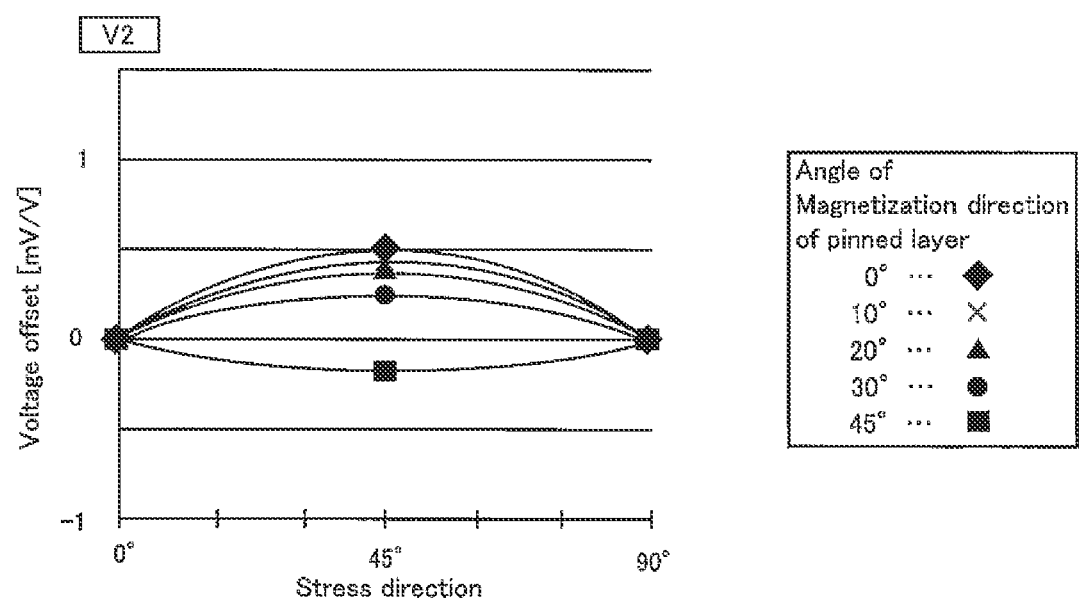
FIG. 8B is a graph showing the relationship between voltage offset and the applied angle of external stress at an output voltage V2 when the pinned layer of the magnetic sensor is inclined at 0°, 10°, 20°, 300 and 45°, respectively.
Figure 8C:
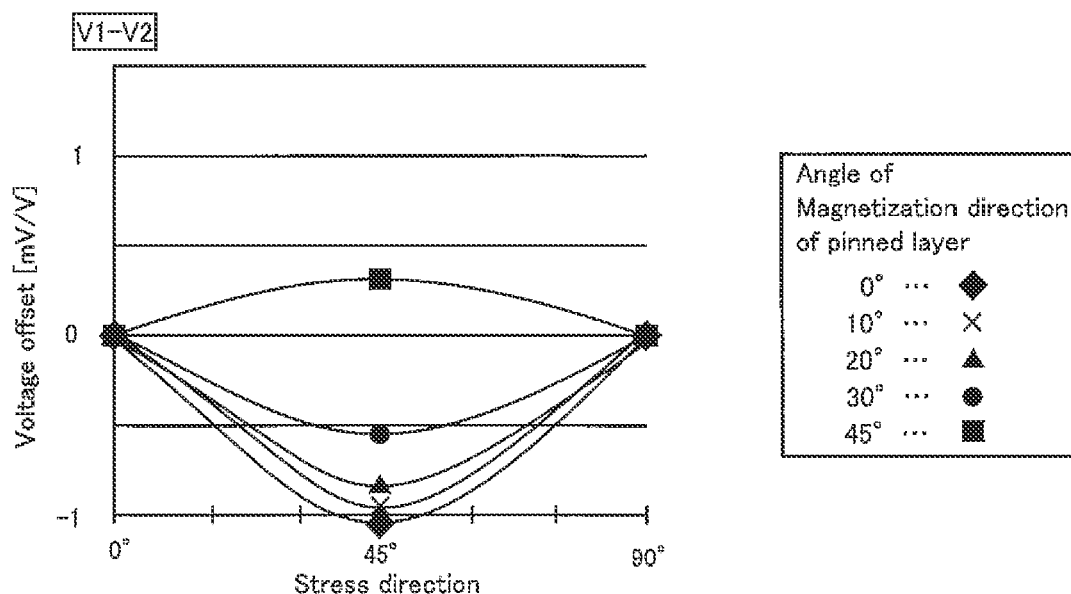
FIG. 8C is a graph showing the relationship between voltage offset and the applied angle of external stress at an output voltage (V1-V2) when the pinned layer of the magnetic sensor is inclined at 0°, 10°, 20°, 300 and 45°, respectively.

FIGS. 8A-C are graphs showing the output voltages V1 and V2 with respect to external stress when the magnetization direction of the pinned layer 42 is inclined at 0°, 10°, 20°, 300 and 45°, respectively, with respect to the approximately straight line 7 of the magnetic sensor 1 shown in FIG. 6, and the change in the difference (V1-V2) of the outputs. In the magnetic sensor 1 in a state in which the pinned layer 42 is at 0°, that is to say substantially parallel, to the approximately straight line 7, the voltage offset of the output voltage V1 increases in the negative direction (see FIG. 8A) and the voltage offset of the output V2 increases in the positive direction (see FIG. 8B) when an external stress is applied at 45°. Consequently, the voltage offset of the difference (V1-V2) of the outputs increases in the negative direction (see FIG. 8C), and the effect of the external stress is greatly received. In the magnetic sensor 1 in a state in which the magnetization direction of the pinned layer 42 is inclined at 10°, 200 and 30°, respectively, with respect to the approximately straight line 7, the amount of increase of the difference (V1-V2) of the outputs in the negative direction can be diminished as the angle of the magnetization direction of the pinned layer 42 becomes larger (see FIG. 8C). Furthermore, in the magnetic sensor 1 in which the magnetization direction of the pinned layer 42 is inclined at a 45° angle with respect to the approximately straight line 7, the output V1 increases in the positive direction (see FIG. 8A) and V2 increases in the negative direction (see FIG. 8B), so the voltage offset of the difference (V1-V2) of the outputs is virtually completely suppressed.

Figure 9A:
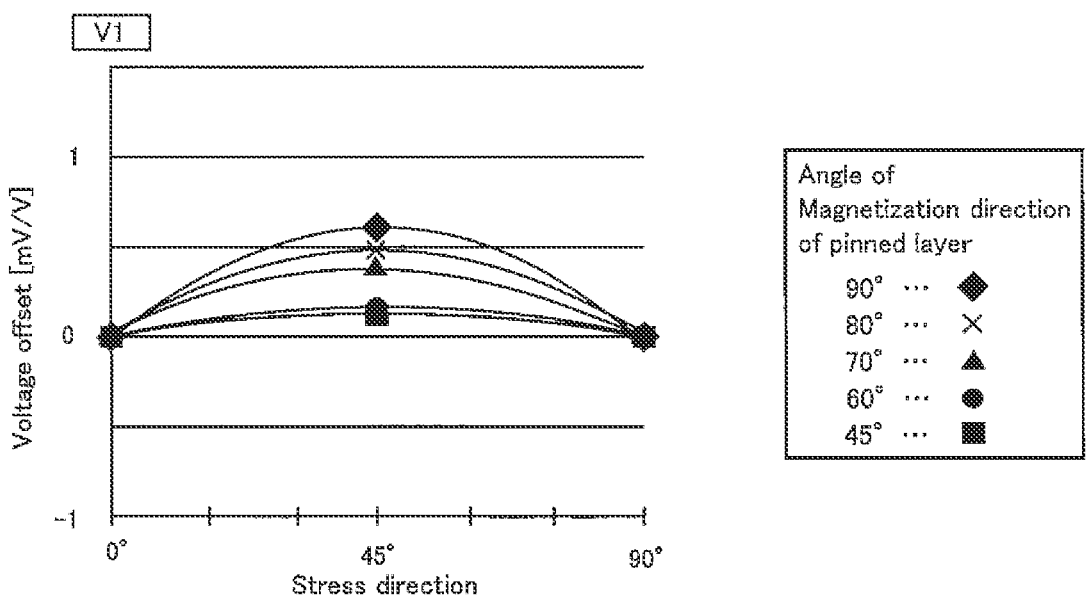
FIG. 9A is a graph showing the relationship between voltage offset and the applied angle of external stress at an output voltage V1 when the pinned layer of the magnetic sensor is inclined at 90°, 80°, 70°, 600 and 45°, respectively.
Figure 9B:
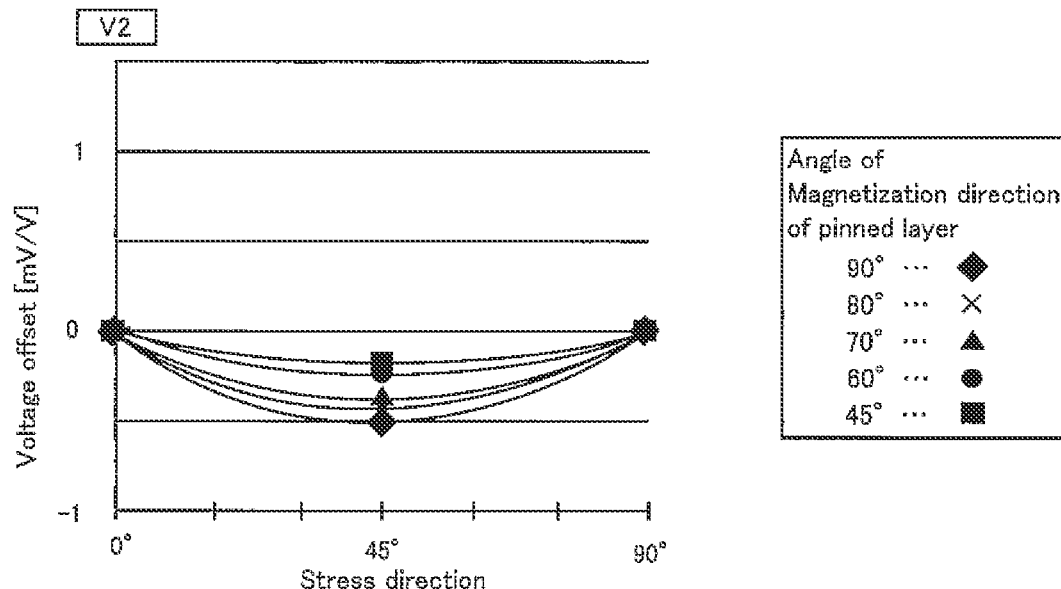
FIG. 9B is a graph showing the relationship between voltage offset and the applied angle of external stress at an output voltage V2 when the pinned layer of the magnetic sensor is inclined at 90°, 80°, 70°, 600 and 45°, respectively.
Figure 9C:
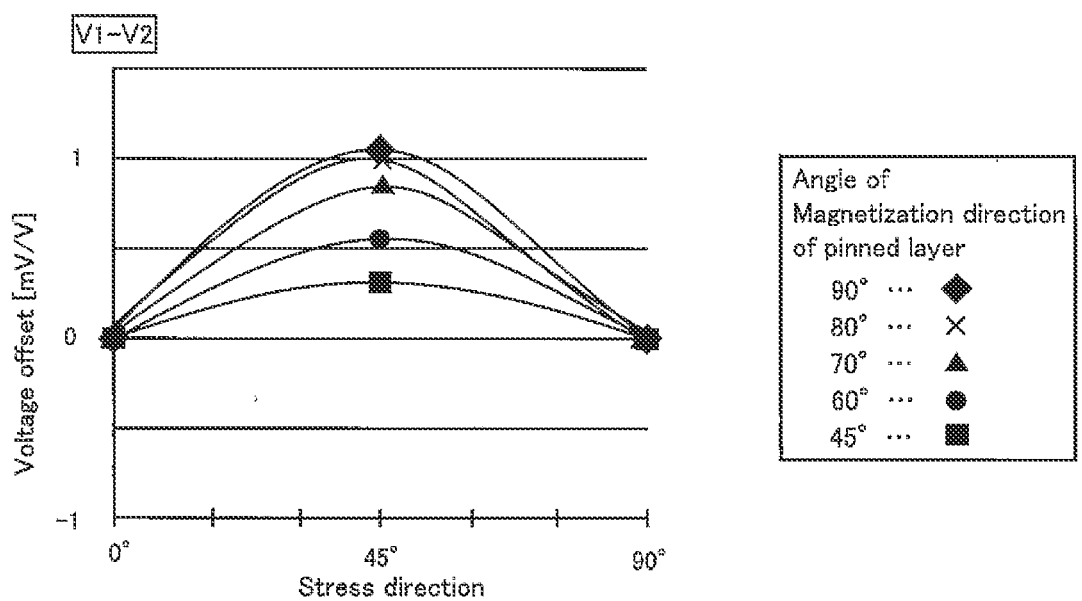
FIG. 9C is a graph showing the relationship between voltage offset and the applied angle of external stress at an output voltage (V1-V2) when the pinned layer of the magnetic sensor is inclined at 90°, 80°, 70°, 600 and 45°, respectively.

FIGS. 9A~C are graphs showing the output voltages V1 and V2 with respect to external stress when the magnetization direction of the pinned layer 42 is inclined at 90°, 80°, 70°, 60° and 45°, respectively, with respect to the approximately straight line 7 of the magnetic sensor 1 shown in FIG. 6, and the change in the difference (V1-V2) of the outputs. In the magnetic sensor 1 in a state in which the pinned layer 42 is at 90°, that is, substantially orthogonal, to the approximately straight line 7, the voltage offset of the output voltage V1 increases in the positive direction (see FIG. 9A) and the voltage offset of the output V2 increases in the negative direction (see FIG. 9B) when an external stress is applied at 45°. Consequently, the voltage offset of the difference (V1-V2) of the outputs increases in the positive direction (see FIG. 9C), and the effect of the external stress is greatly received. In the magnetic sensor 1 in a state in which the magnetization direction of the pinned layer 42 is inclined at 80°, 700 and 60°, respectively, with respect to the approximately straight line 7, the amount of increase of the difference (V1-V2) of the outputs in the positive direction can be diminished as the angle of the magnetization direction of the pinned layer 42 becomes smaller (see FIG. 9C). Furthermore, in the magnetic sensor 1 in which the magnetization direction of the pinned layer 42 is inclined at a 45° angle with respect to the approximately straight line 7, the voltage offset of the difference (V1-V2) of the outputs is virtually completely suppressed.

As shown in FIGS. 8A-C and FIG. 9A-C, by causing the magnetization direction of the pinned layer 42 to be inclined with respect to the approximately straight line 7 in a state in which an external magnetic field is not applied on the magnetoresistive effect element, it is possible to diminish the stress sensitivity and to reduce fluctuations in voltage offset. The angle of inclination of the pinned layer 42 is not particularly restricted as long as such is within a range capable of reducing fluctuation in the voltage offset, and inclination within a range of 10~80° with respect to the approximately straight line 7 is particularly preferable.

Figure 10A:
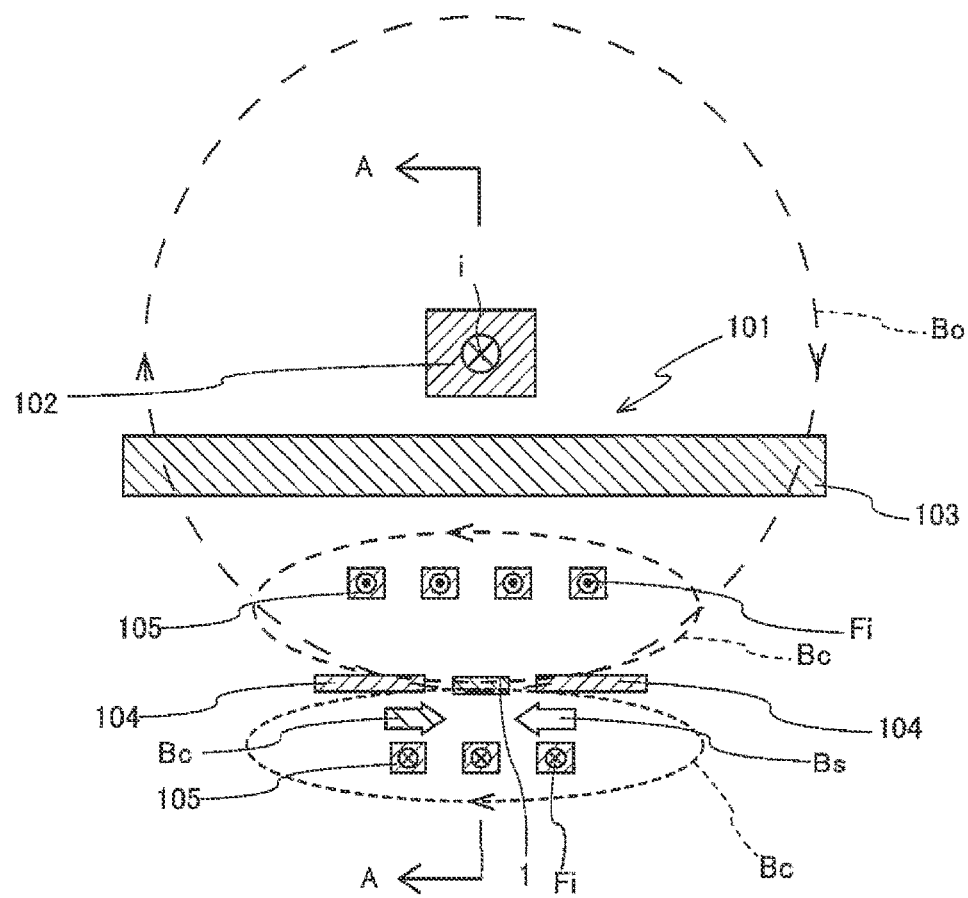
FIG. 10A is an end view showing a schematic configuration of an electric current sensor equipped with the magnetic sensor of the present invention.
Figure 10B:
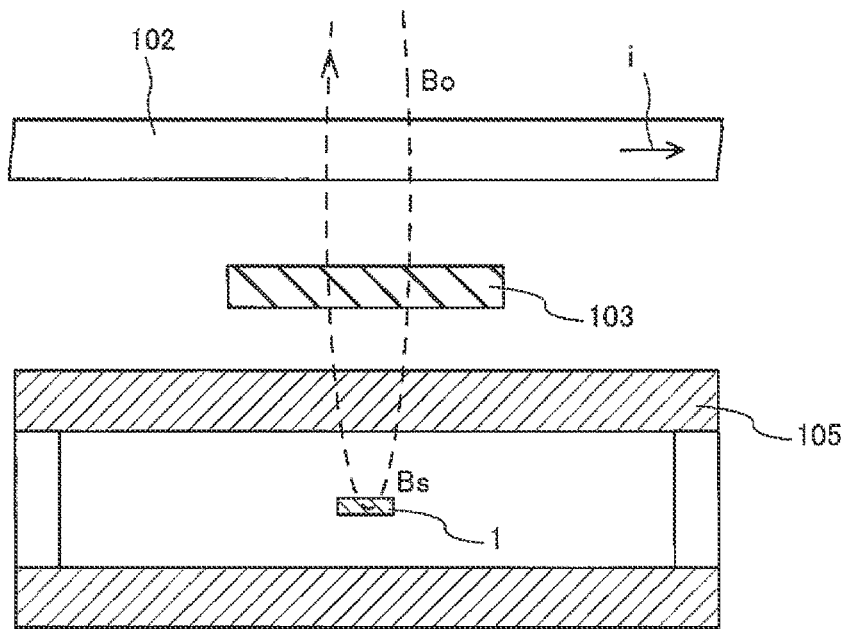
FIG. 10B is a cross-sectional view along line A-A of the electric current sensor shown in FIG. 10A.

The magnetic sensor 1 described above can be used in an electric current sensor, for example. FIG. 10A is a schematic end view of an electric current sensor equipped with the magnetic sensor 1, and FIG. 10B is a cross-sectional view along line A-A in FIG. 10A. The magnetic sensor 1 is positioned near an electric current line 102 and causes generation of a magnetoresistive change in accordance with change in a signal magnetic field Bs that is applied. An electric current sensor 101 has a first soft magnetic material 103 and a second soft magnetic material 104, for adjusting the magnetic field strength, and a solenoid-type feedback coil 105, which is provided near the magnetic sensor 1.

The feedback coil 105 causes generation of a magnetic field Bc that cancels the signal magnetic field Bs. The feedback coil 105 is wound in a spiral shape around the magnetic sensor 1 and the second soft magnetic material 104. An electric current i flows in the electric current line 102 from the front side of the paper to the back side in FIG. 10A and from left to right in FIG. 10B. Through this electric current i, a clockwise external magnetic field Bo is induced in FIG. 10A. The external magnetic field Bo is mitigated by the first soft magnetic material 103, is amplified by the second soft magnetic material 104 and is applied leftward on the magnetic sensor 1 as the signal magnetic field Bs. The magnetic sensor 1 outputs a voltage signal corresponding to the signal magnetic field Bs, and this voltage signal is input into the feedback coil 105. In the feedback coil 105, the feedback electric current Fi flows, and the feedback electric current Fi generates a cancel magnetic field Bc that cancels the signal magnetic field Bs. Because the signal magnetic field Bs and the cancel magnetic field Bc have the same absolute value but are opposite in direction, the signal magnetic field Bs is offset by the cancel magnetic field Bc, so that the magnetic field that is applied on the magnetic sensor 1 become substantially zero. The feedback electric current Fi is converted into a voltage by a resistor (undepicted) and is output as a voltage value. The voltage value is proportional to the feedback electric current Fi, the cancel magnetic field Be and the signal magnetic field Bs, so it is possible to obtain an electric current that flows in the electric current line 102 from the voltage value.

The above-described embodiment was described in order to facilitate understanding of the present invention and was not described to limit the present invention. Accordingly, all components disclosed in the above-described embodiment shall be construed to include all design modifications and equivalents falling within the technical scope of the present invention.

Figure 11:
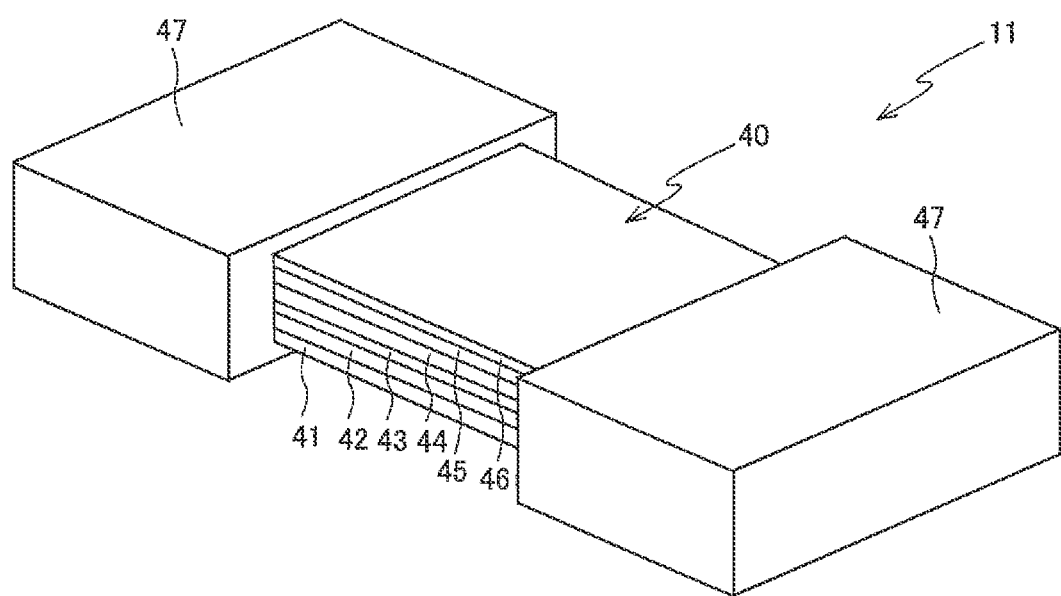
FIG. 11 is a perspective view showing the schematic configuration of a magnetoresistive effect element of a magnetic sensor according to another embodiment of the present invention.

In the above-described embodiment, the multilayer film 40 that makes up the magnetoresistive effect elements was described by taking as an example one that includes the antiferromagnetic layer 41, the pinned layer 42, the spacer layer 45 and the free layer 46, but this is intended to be illustrative and not limiting, for it would be fine to include a nonmagnetic intermediate layer 43 and a reference layer 44 between the pinned layer 42 and the spacer layer 45, for example (see FIG. 11). The reference layer 44 is a ferromagnetic layer interposed between the pinned layer 42 and the spacer layer 45, is magnetically coupled with the pinned layer 42 via the nonmagnetic intermediate layer 43 made of Ru, Rh or the like, and more specifically is antiferromagnetically coupled with the pinned layer 42. Accordingly, the reference layer 44 and the pinned layer 42 both have magnetization directions fixed with respect to the external magnetic field, and the magnetization directions thereof are in orientations antiparallel to each other. Through this, even when the magnetization direction of the reference layer 44 stabilizes, the magnetic field discharged from the reference layer 44 is canceled by the magnetic field discharged from the pinned layer 42, so that it is possible to suppress any magnetic field leakage to the outside. In this case, the magnetization direction of the reference layer 44 can be inclined with respect to the approximately straight line 7.

EMBODIMENTS

Below, the present invention will be described in greater detail through embodiments, but the present invention is in no way limited by the below-described embodiments or the like.

Embodiment 1

Figure 12A:
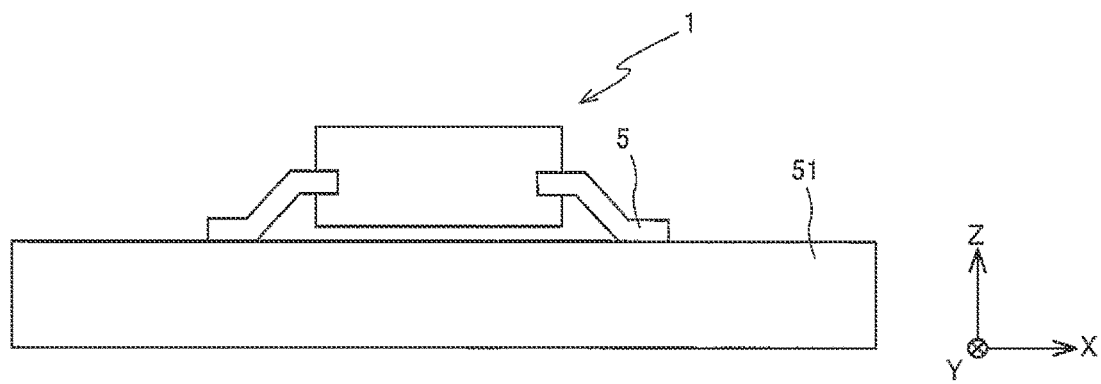
FIG. 12A is a side view of the magnetic sensor fixed to a substrate.
Figure 12B:
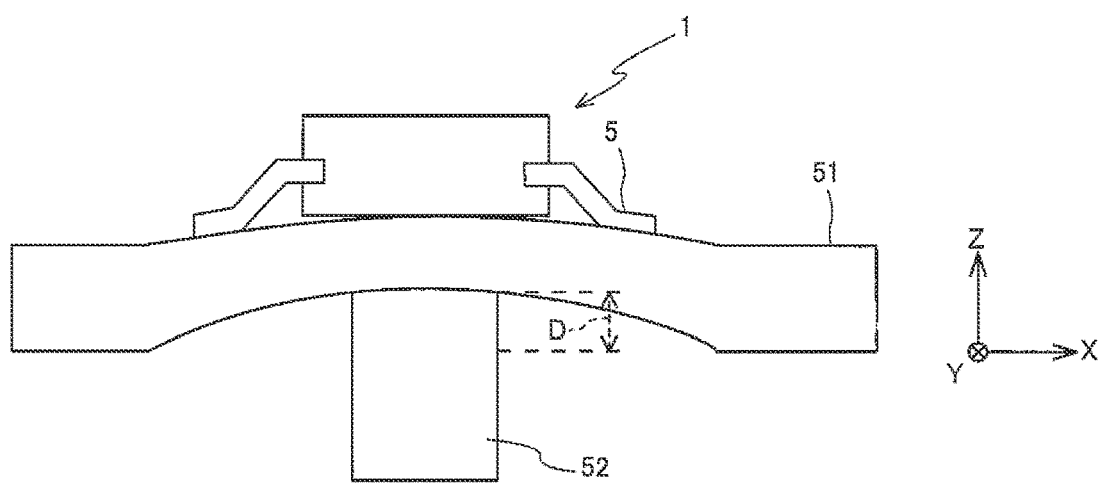
FIG. 12B is a side view when a plate is pressed against the back side of the substrate.
Figure 12C:
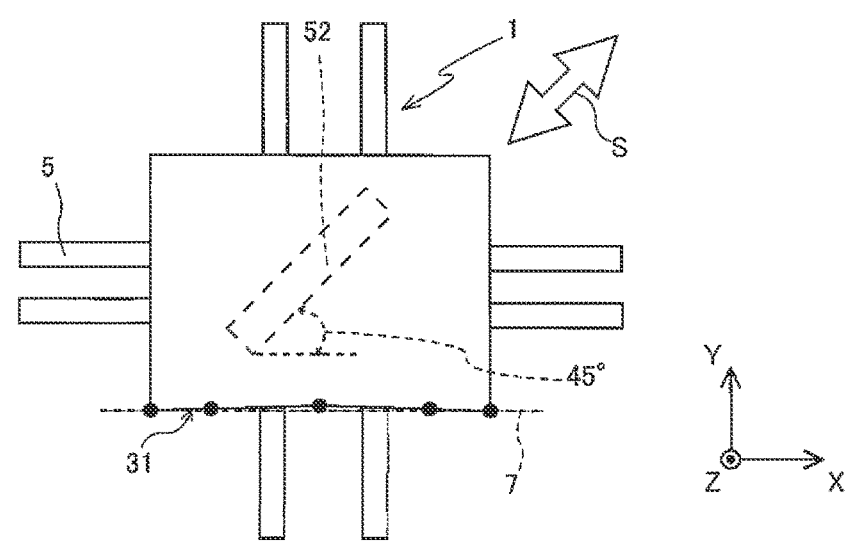
FIG. 12C is a top view when a plate is pressed against the substrate at a 45° angle with respect to an approximately straight line.

A magnetic sensor 1 having the configuration shown in FIG. 6 and with the magnetization direction of the pinned layer 42 with respect to the approximately straight line 7 being 45° was prepared, and the changes in the outputs V1 and V2 of the magnetic sensor 1 and the difference (V1-V2) of the outputs in a state in which the tensile stress S (see FIG. 3C) was applied on the magnetic sensor 1 were measured. The state in which the tensile stress S was applied on the magnetic sensor 1 was realized through the simulated load method described below. FIGS. 12A~12C are drawings describing the simulated load addition method of the magnetic sensor. First, the magnetic sensor 1 is fixed to a substrate 51 through soldering of the lead wires 5 (see FIG. 12A). Next, a plate 52 is pressed in the +Z direction against the back surface (surface on the side opposite the surface to which the magnetic sensor 1 is fixed) side of the substrate 51 (see FIG. 12B). Because the substrate 51 curves so that the front surface (the surface to which the magnetic sensor 1 is fixed) side becomes convex, the lead wires 5 deform to spread to the outside. Through this, it is possible to apply the tensile stress S on the magnetic sensor 1 via the lead wires 5. FIG. 12C is a top view of when the plate 52 is pressed against the substrate 51 at a 45° angle with respect to the approximately straight line 7 in the plan view from the +Z direction side of FIG. 12B, and through this, application of the tensile stress S (the tensile stress S at a 45° angle with respect to the approximately straight line 7) shown in FIG. 3C was realized.

Figure 13A:
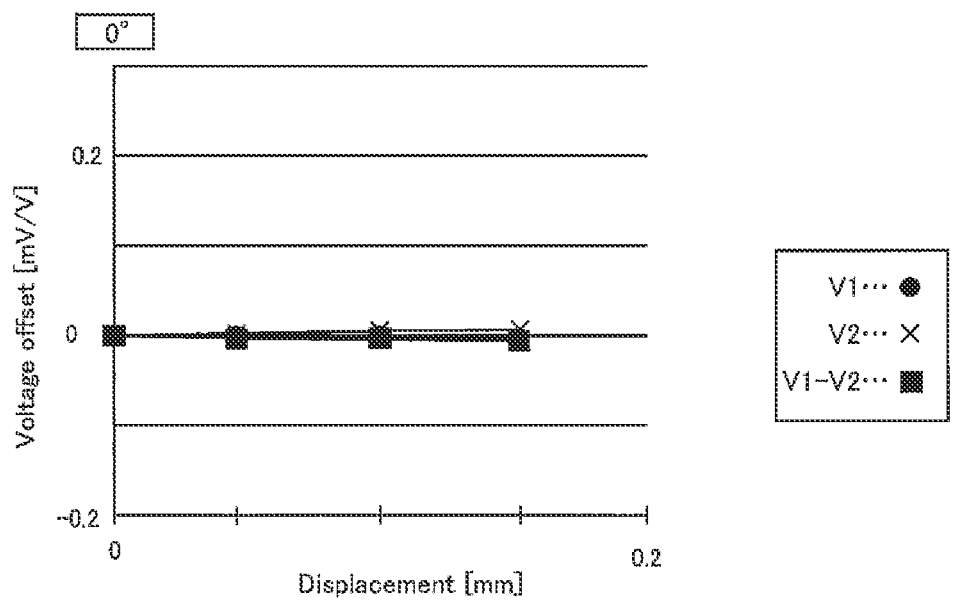
FIG. 13A is a graph showing the relationship between the voltage offset and the displacement in Embodiment 1 when an external stress is applied at a 0° angle.
Figure 13B:
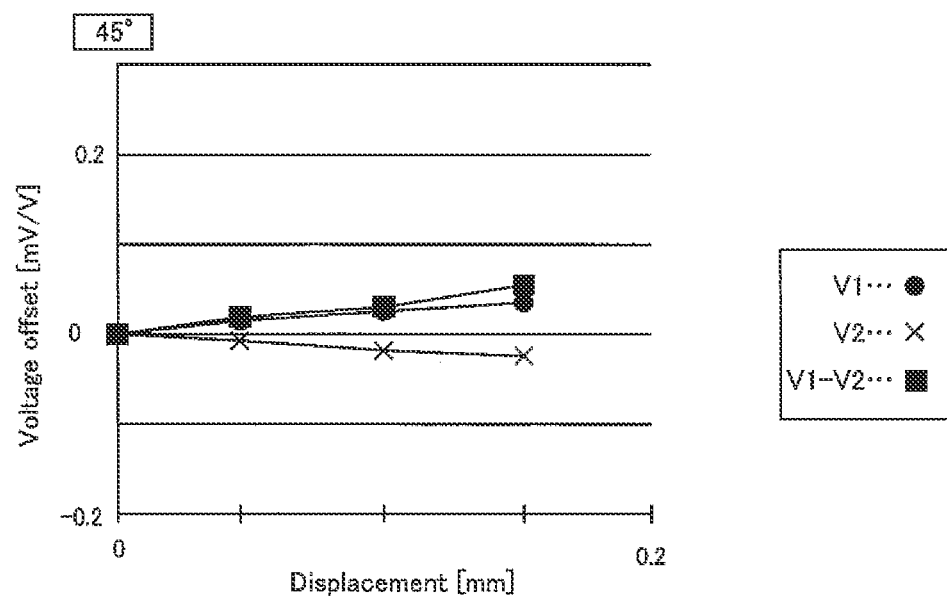
FIG. 13B is a graph showing the relationship between the voltage offset and the displacement in Embodiment 1 when an external stress is applied at a 45° angle.
Figure 13C:
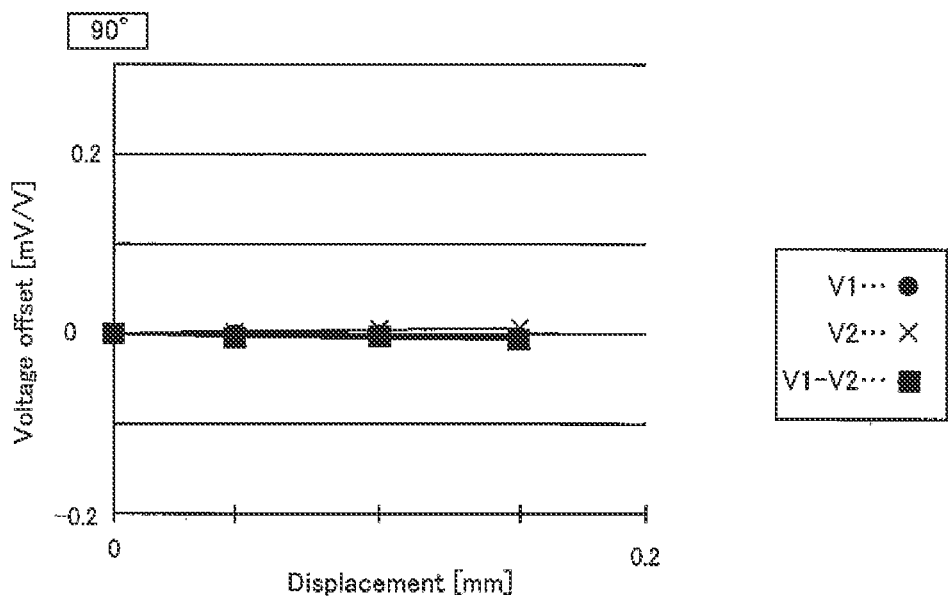
FIG. 13C is a graph showing the relationship between the voltage offset and the displacement in Embodiment 1 when an external stress is applied at a 90° angle.

In Embodiment 1, the plate 52 was pressed against the substrate 51 at 0°, 45° and 90° angles with respect to the approximately straight line 7, and the change in the outputs V1 and V2 and the difference (V1-V2) of the outputs was measured when the +Z direction displacement D of the substrate 51 was caused to change. Results are shown in FIGS. 13A~13C. In the graphs shown in FIGS. 13A-13C, the horizontal axis indicates the displacement D (mm) and the vertical axis indicates the voltage offset (mV/V). The voltage offset is found as the difference between the outputs V1 and V2 and the difference (V1-V2) of the outputs of the magnetic sensor 1 in a state in which the tensile stress S is not applied, and the outputs V1 and V2 and the difference (V1-V2) of the outputs of the magnetic sensor 1 in a state in which the tensile stress S is applied.

Embodiment 2

Figure 7:
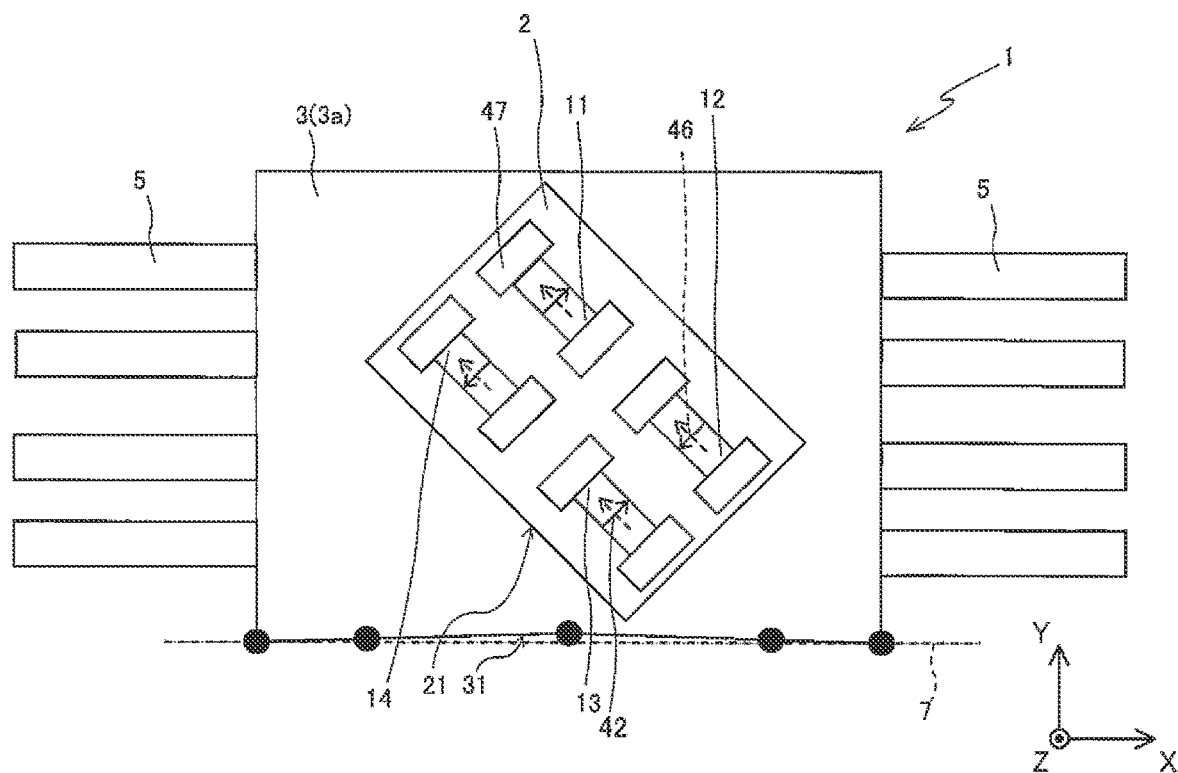
FIG. 7 is a plan view showing the positional relationship between the magnetization direction of the pinned layer and the sealed part and magnetic sensor chip of the magnetic sensor according to another embodiment of the present invention.
Figure 14A:
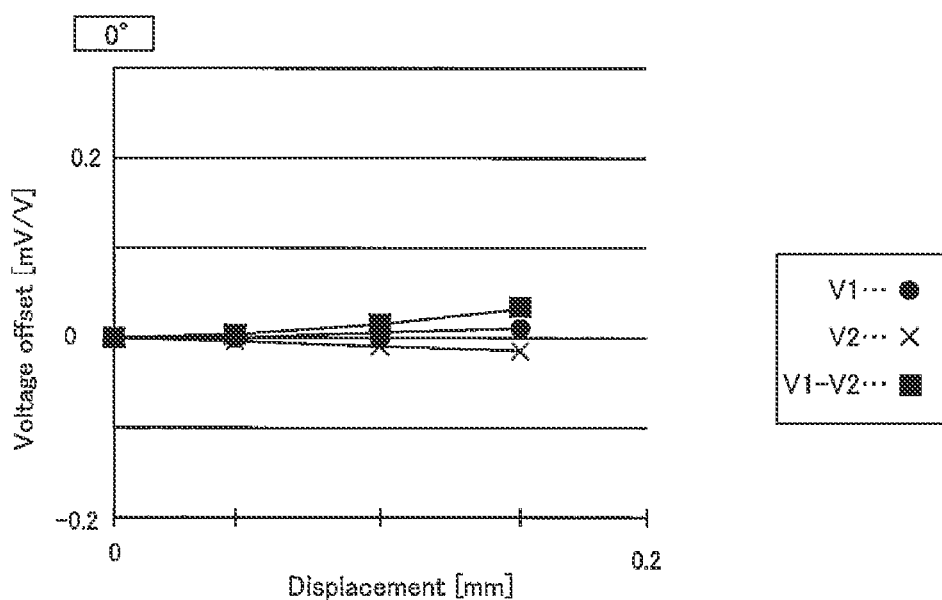
FIG. 14A is a graph showing the relationship between the voltage offset and the displacement in Embodiment 2 when an external stress is applied at a 0° angle.
Figure 14B:
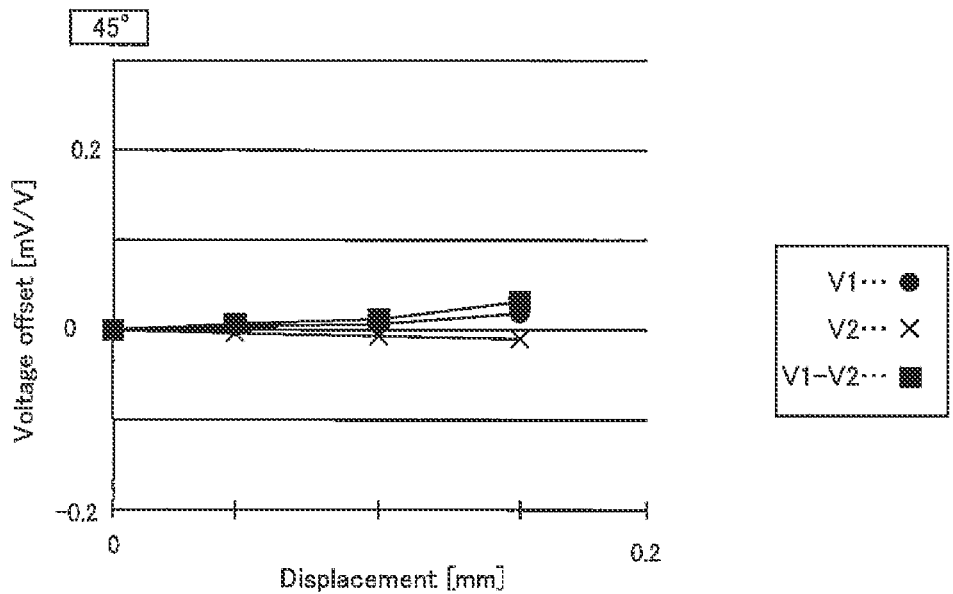
FIG. 14B is a graph showing the relationship between the voltage offset and the displacement in Embodiment 2 when an external stress is applied at a 45° angle.
Figure 14C:
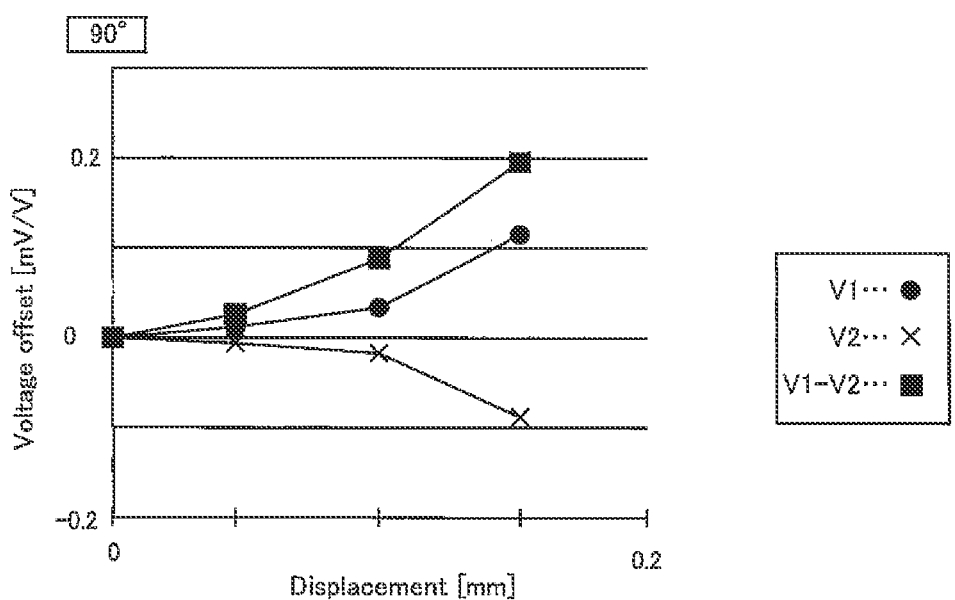
FIG. 14C is a graph showing the relationship between the voltage offset and the displacement in Embodiment 2 when an external stress is applied at a 90° angle.

Using the same load addition method as Embodiment 1 (see FIGS. 12A-12C), the tensile stress S was applied by pressing the plate 52 on the substrate 51 at 0°, 45° and 90° angles against the magnetic sensor 1 having the configuration shown in FIG. 7 and in which the angle of inclination of the first side 21 of the magnetic sensor chip 2 with respect to the approximately straight line 7 was 45°, and changes in the outputs V1 and V2 and the difference (V1-V2) of the outputs when the +Z displacement D of the substrate 51 was caused to change were measured. Results are shown in FIGS. 14A~14C. In the graphs shown in FIGS. 14A~14C, the horizontal axis indicates the displacement D (mm) and the vertical axis indicates the voltage offset (mV/V). The voltage offset is found as the difference between the outputs V1 and V2 and the difference (V1-V2) of the outputs of the magnetic sensor 1 in a state in which the tensile stress S is not applied, and the outputs V1 and V2 and the difference (V1-V2) of the outputs of the magnetic sensor 1 in a state in which the tensile stress S is applied.

Comparison Example 1

Figure 15A:
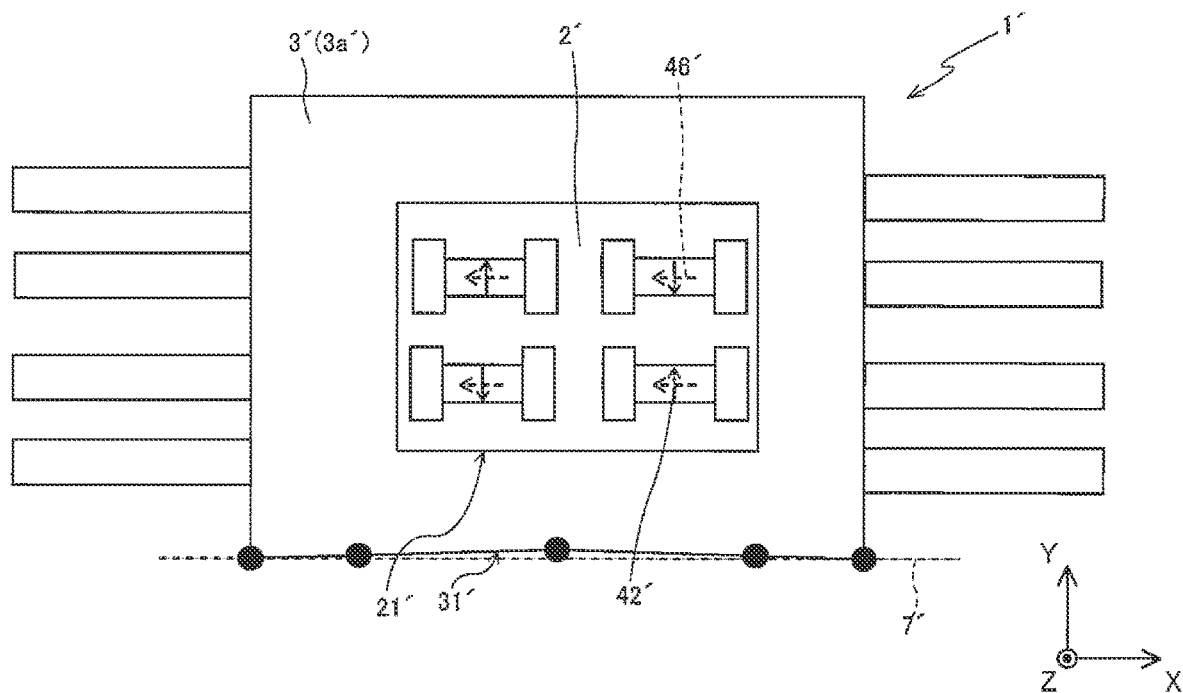
FIG. 15A is a plan view from a first surface side of the magnetic sensor of Comparison Example 1.

A magnetic sensor 1' having the configuration shown in FIG. 15A was prepared. FIG. 15A is a plan view of the magnetic sensor 1' of Comparison Example 1. In the magnetic sensor 1' shown in FIG. 15A, in the plan view from a first surface 3a' side of a sealed part 3', the magnetization direction of a pinned layer 42' is substantially orthogonal to an approximately straight line 7' calculated through the least squares method using a plurality of points arbitrarily set on a first side 31' the sealed part 3' has.

Figure 16A:
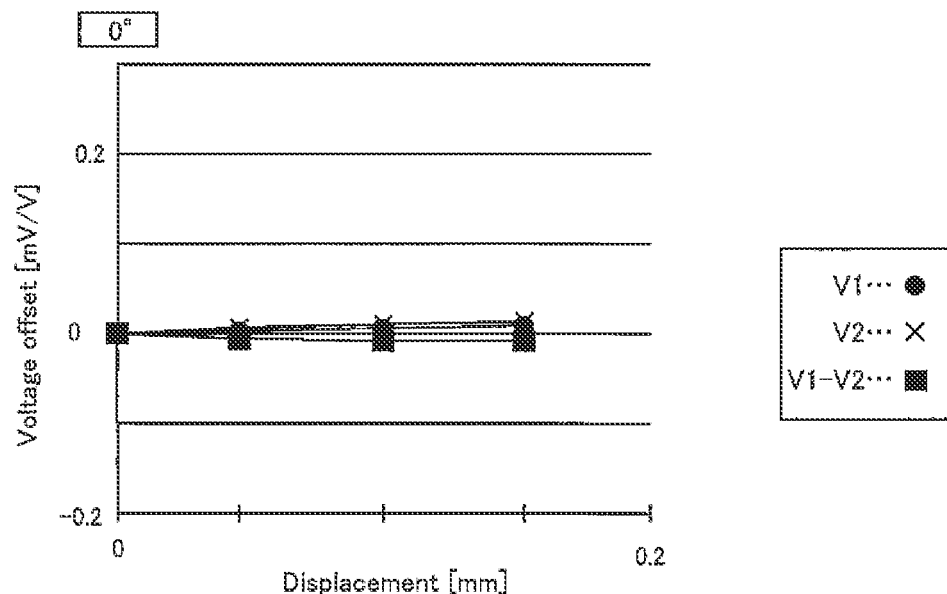
FIG. 16A is a graph showing the relationship between the voltage offset and displacement in Comparison Example 1 when an external stress is applied at a 0° angle.
Figure 16B:
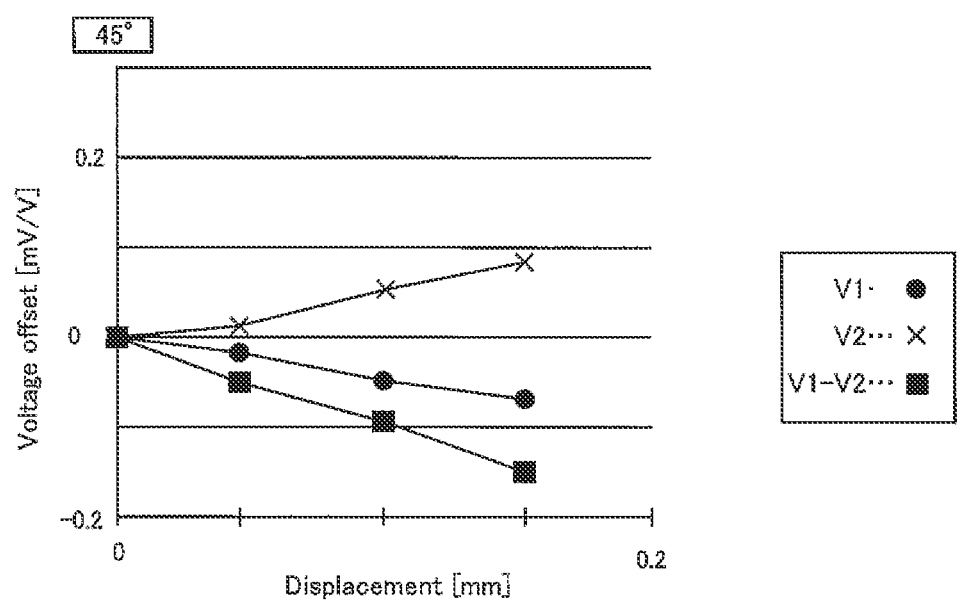
FIG. 16B is a graph showing the relationship between the voltage offset and displacement in Comparison Example 1 when an external stress is applied at a 45° angle.
Figure 16C:
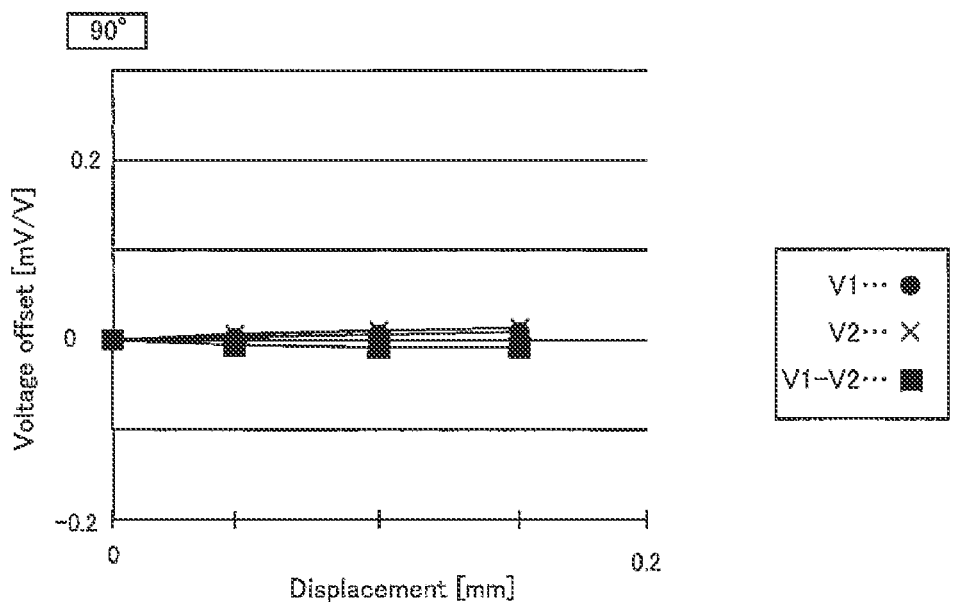
FIG. 16C is a graph showing the relationship between the voltage offset and displacement in Comparison Example 1 when an external stress is applied at a 90° angle.

Using the same load addition method as Embodiment 1 (see FIGS. 12A~12C), the tensile stress S was applied by pressing the plate 52 on the substrate 51 at 0°, 45° and 90° angles against the magnetic sensor 1' having the configuration shown in FIG. 15A, and changes in the outputs V1 and V2 and the difference (V1-V2) of the outputs when the +Z displacement D of the substrate 51 was caused to change were measured. Results are shown in FIGS. 16A~16C. In the graphs shown in FIGS. 16A~16C, the horizontal axis indicates the displacement D (mm) and the vertical axis indicates the voltage offset (mV/V). The voltage offset is found as the difference between the outputs V1 and V2 and the difference (V1-V2) of the outputs of the magnetic sensor 1' in a state in which the tensile stress S is not applied, and the outputs V1 and V2 and the difference (V1-V2) of the outputs of the magnetic sensor 1' in a state in which the tensile stress S is applied.

Comparison Example 2

Figure 15B:
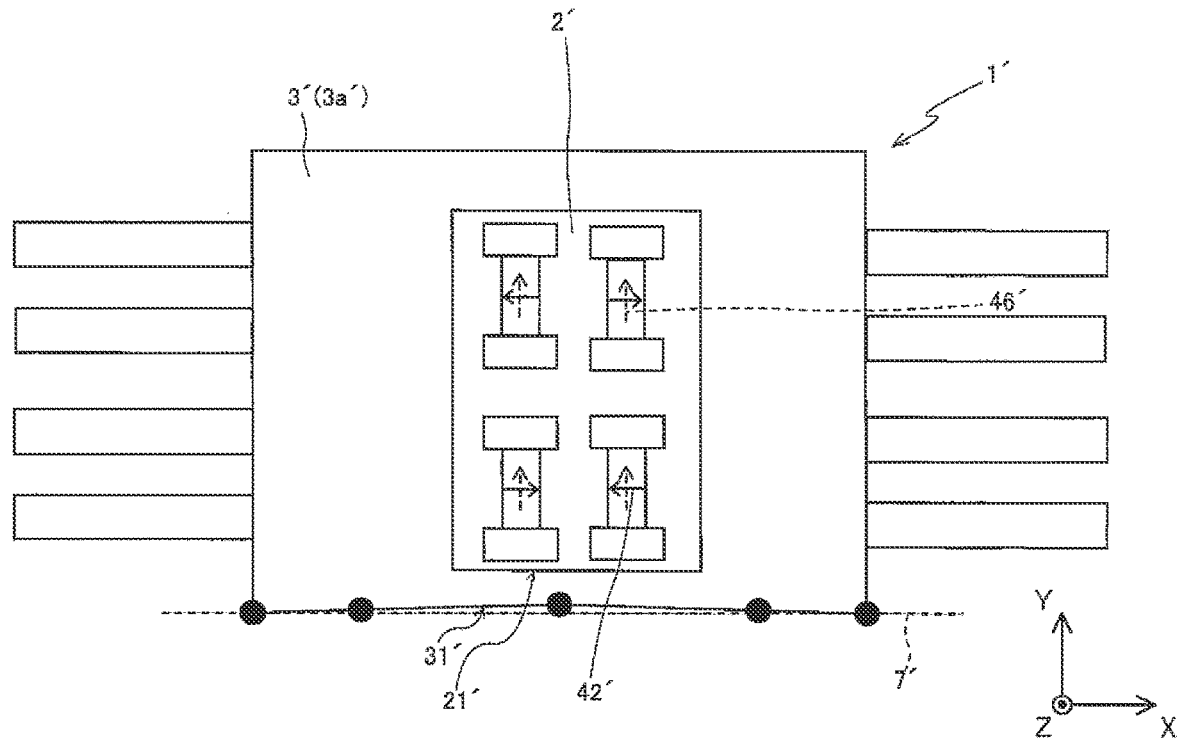
FIG. 15B is a plan view from a first surface side of the magnetic sensor of Comparison Example 2.

A magnetic sensor 1' having the configuration shown in FIG. 15B was prepared. FIG. 15B is a plan view of the magnetic sensor 1' of Comparison Example 2. In the magnetic sensor 1' shown in FIG. 15B, when a magnetic sensor chip 2' is viewed from a first surface 3a' side of a sealed part 3', the magnetization direction of a pinned layer 42' in a state in which the external magnetic field is not applied on the magnetoresistive effect element is substantially parallel to a first side 21' of the magnetic sensor chip 2'.

Figure 17A:
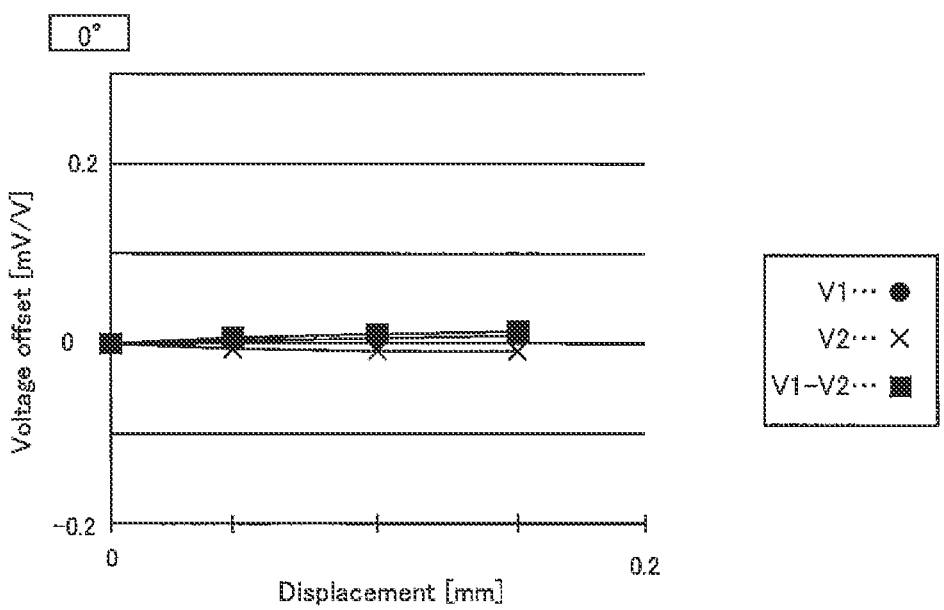
FIG. 17A is a graph showing the relationship between the voltage offset and displacement in Comparison Example 2 when an external stress is applied at a 0° angle.
Figure 17B:
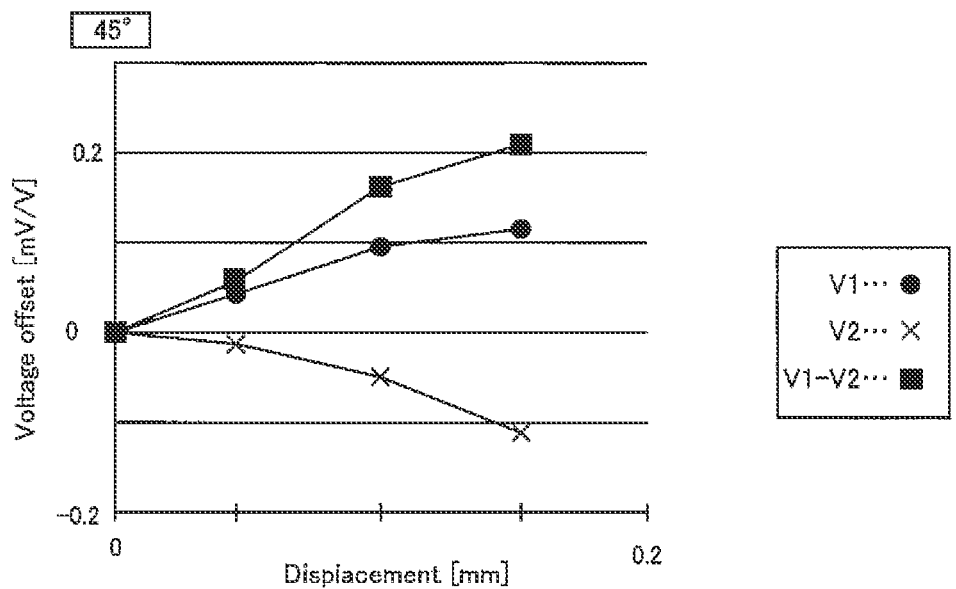
FIG. 17B is a graph showing the relationship between the voltage offset and displacement in Comparison Example 2 when an external stress is applied at a 45° angle.
Figure 17C:
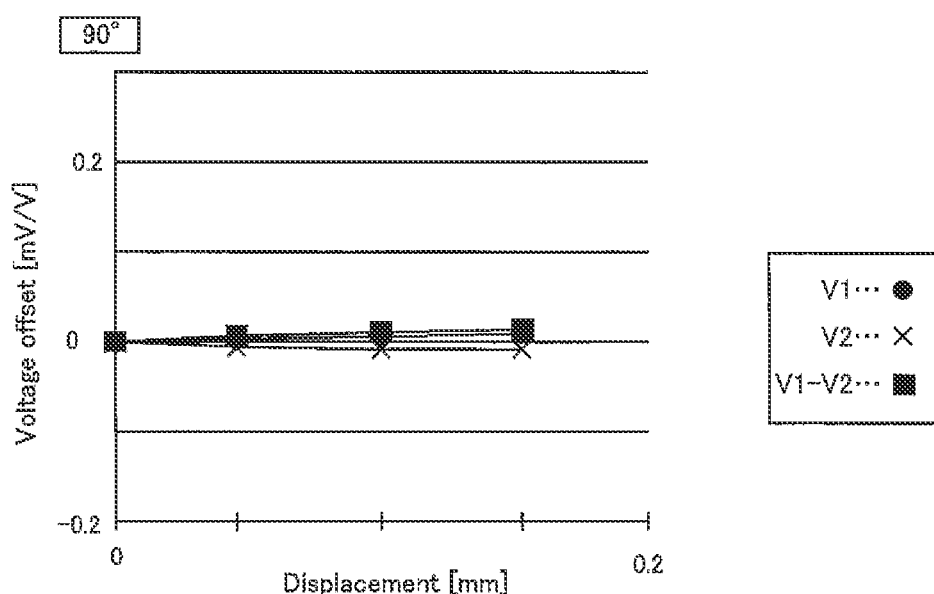
FIG. 17C is a graph showing the relationship between the voltage offset and displacement in Comparison Example 2 when an external stress is applied at a 90° angle.

Using the same load addition method as Embodiment 1 (see FIGS. 12A-12C), the tensile stress S was applied by pressing the plate 52 on the substrate 51 at 0°, 45° and 90° angles against the magnetic sensor 1' having the configuration shown in FIG. 15B, and changes in the outputs V1 and V2 and the difference (V1-V2) of the outputs when the +Z displacement D of the substrate 51 was caused to change were measured. Results are shown in FIGS. 17A~17C. In the graphs shown in FIGS. 17A-17C, the horizontal axis indicates the displacement D (mm) and the vertical axis indicates the voltage offset (mV/V). The voltage offset is found as the difference between the outputs V1 and V2 and the difference (V1-V2) of the outputs of the magnetic sensor 1' in a state in which the tensile stress S is not applied, and the outputs V1 and V2 and the difference (V1-V2) of the outputs of the magnetic sensor 1' in a state in which the tensile stress S is applied.

In the magnetic sensors of Comparison Example 1 and Comparison Example 2, it was confirmed that fluctuations in the voltage offset when the tensile stress S is applied at 0° and 90° angles is small (see FIG. 16A, FIG. 16C, FIG. 17A and FIG. 17C), but when the tensile stress S is applied at a 45° angle, the displacement D increases and accordingly the voltage offset became large (see FIG. 16B and FIG. 17B). On the other hand, in the magnetic sensor of Embodiment 1, it was confirmed that fluctuations in the voltage offset when the tensile stress S was applied at 0° and 90° angles was small, similar to Comparison Example 1 and Comparison Example 2 (see FIG. 13A and FIG. 13C), but when the tensile stress S is applied at a 45° angle, fluctuations in the voltage offset were suppressed more than in Comparison Example 1 and Comparison Example 2 (see FIG. 13B).

In addition, in the magnetic sensor of Embodiment 2, it was confirmed that fluctuations in voltage offset were suppressed more than in Comparison Example 1 and Comparison Example 2 (see FIGS. 14A, 14B) when the tensile stress S was applied at 0° and 45° angles. On the other hand, when the tensile stress S was applied at a 90° angle, it was confirmed that the displacement D increases and accordingly the voltage offset becomes larger (see FIG. 14C). From this, it can be said that when the direction (angle) at which external stress is applied in accordance with the application or the like of the magnetic sensor is known, it is possible to optimize placement of the magnetic sensor chip 2 inside the magnetic sensor 1 in accordance thereto. The reason the voltage offset becomes larger when the tensile stress S is applied at a 90° angle is conjectured to be because by having the first side 21, the second side 22, the third side 23 and the fourth side 24 possessed by the magnetic sensor chip 2 be inclined at a 45° angle with respect to the applied tensile stress S, the influence of the tensile stress S applied on the magnetic sensor chip 2 becomes large so the voltage offset becomes large.

DESCRIPTION OF SYMBOLS

1 Magnetic sensor
2 Magnetic sensor chip
21 First side
3 Sealed part
31 First side
7 Approximately straight line
11~14 First through fourth magnetoresistive effect elements
41 Antiferromagnetic layer
42 Pinned layer
43 Spacer layer
46 Free layer
47 Bias magnet

The invention claimed is:

1. A magnetic sensor comprising:
a magnetic sensor chip that includes a magnetoresistive effect element; and
a die having a mounting surface for mounting the magnetic sensor chip;
wherein the magnetoresistive effect element includes a free layer, a magnetization direction of the free layer which can change in accordance with an external magnetic field, and a pinned layer, a magnetization direction of the pinned layer which is fixed;
a shape of the die in a plan view from the mounting surface side is substantially quadrilateral;
the substantially quadrilateral shape has a first side and a second side, which are substantially parallel to each other, and a third side and a fourth side, which are substantially parallel to each other and that intersect the first side and the second side; and
in the plan view from the mounting surface side of the die, the magnetization direction of the pinned layer, in a state in which the external magnetic field is not applied on the magnetoresistive effect element, is inclined with respect to an approximately straight line found through the least squares method using a plurality of points arbitrarily set on the first side;
in the plan view from the mounting surface side of the die, the magnetization direction of the free layer, in a state in which the external magnetic field is not applied on the magnetoresistive effect element, is substantially orthogonal to the magnetization direction of the pinned layer.

2. The magnetic sensor according to claim 1, wherein the magnetization direction of the pinned layer, in a state in which the external magnetic field is not applied on the magnetoresistive effect element, is inclined at an angle of 10-80° with respect to the approximately straight line.

3. The magnetic sensor according to claim 1, wherein:
the magnetic sensor chip includes a plurality of the magnetoresistive effect elements;
the magnetoresistive effect elements have a substantially rectangular shape or a substantially oval shape in a plan view, respectively; and
the magnetization directions of the free layers of the magnetoresistive effect elements in a state in which the external magnetic field is not applied on the plurality of magnetoresistive effect elements are substantially parallel to length wise directions of the magnetoresistive effect elements in the plan view.

4. The magnetic sensor according to claim 1, wherein:
the magnetoresistive effect element has a substantially rectangular shape or a substantially oval shape in a plan view; and
a length wise direction of the magnetoresistive effect element in the plan view is inclined with respect to the approximately straight line.

5. The magnetic sensor according to claim 1, wherein the magnetoresistive effect element is a GMR element or a TMR element.

6. The magnetic sensor according to claim 1, wherein:
the magnetoresistive effect element has a lengthwise direction and a widthwise direction which is orthogonal to the lengthwise direction, and
the lengthwise direction of the magnetoresistive effect element is substantially parallel to the approximately straight line found through the least squares method using a plurality of points arbitrarily set on the first side.

7. The magnetic sensor according to claim 1, wherein:
the magnetoresistive effect element has a lengthwise direction and a widthwise direction which is orthogonal to the lengthwise direction, and
the lengthwise direction of the magnetoresistive effect element is inclined with respect to an approximately straight line found through the least squares method using a plurality of points arbitrarily set on the first side.

* * * * *